(12) United States Patent
Lee

(10) Patent No.: US 11,335,687 B2
(45) Date of Patent: May 17, 2022

(54) MEMORY DEVICE

(71) Applicant: SK hynix Inc., Icheon-si (KR)

(72) Inventor: Ki Hong Lee, Icheon-si (KR)

(73) Assignee: SK hynix Inc., Icheon-si (KR)

(*) Notice: Subject to any disclaimer, the term of this patent is extended or adjusted under 35 U.S.C. 154(b) by 113 days.

(21) Appl. No.: 16/939,842

(22) Filed: Jul. 27, 2020

(65) Prior Publication Data

US 2021/0257366 A1    Aug. 19, 2021

(30) Foreign Application Priority Data

Feb. 19, 2020 (KR) .................. 10-2020-0020244

(51) Int. Cl.
| | | |
|---|---|---|
| *H01L 27/108* | (2006.01) | |
| *H01L 49/02* | (2006.01) | |
| *H01L 29/786* | (2006.01) | |
| *H01L 29/423* | (2006.01) | |
| *H01L 29/06* | (2006.01) | |

(52) U.S. Cl.
CPC .. *H01L 27/10805* (2013.01); *H01L 27/10897* (2013.01); *H01L 28/86* (2013.01); *H01L 29/0673* (2013.01); *H01L 29/42392* (2013.01); *H01L 29/78618* (2013.01); *H01L 29/78696* (2013.01)

(58) Field of Classification Search
CPC ............... H01L 27/0688; H01L 27/108; H01L 27/10805; H01L 27/1085; H01L 27/10882; H01L 27/10885; H01L 27/10891; H01L 27/10897; H01L 27/115; H01L 28/40; H01L 28/55; H01L 28/60; H01L 28/86; H01L 28/90; H01L 29/0673; H01L 29/4011; H01L 29/402; H01L 29/42392; H01L 29/7841; H01L 29/78618; H01L 29/78696; H01L 29/792; H01L 29/7926; G11C 7/18; G11C 11/4097; G11C 16/0483
See application file for complete search history.

(56) References Cited

U.S. PATENT DOCUMENTS

2018/0286868 A1* 10/2018 Lu ..................... H01L 21/02164

\* cited by examiner

*Primary Examiner* — Cheung Lee
(74) *Attorney, Agent, or Firm* — William Park & Associates Ltd.

(57) ABSTRACT

A memory cell includes: a bit line and a plate line that are spaced apart from each other and vertically oriented in a first direction; a transistor including an active layer, the active layer being laterally oriented in a second direction, intersecting with the bit line; a capacitor laterally oriented in the second direction between the active layer and the plate line; and a word line laterally oriented in a third direction, intersecting with the bit line and the active layer, wherein the word line is embedded in the active layer.

20 Claims, 24 Drawing Sheets

MEMORY DEVICE

CROSS-REFERENCE TO RELATED APPLICATIONS

The present application claims priority of Korean Patent Application No. 10-2020-0020244, filed on Feb. 19, 2020, which is incorporated herein by reference in its entirety.

BACKGROUND

1. Field

Exemplary embodiments of the present invention relate to a semiconductor device, and more particularly, to a three-dimensional memory device with improved degree of integration.

2. Description of the Related Art

Since the degree of integration of a two-dimensional or planar semiconductor device is mainly determined by the area that is occupied by a unit memory cell, the degree of integration is greatly affected by the level of fine pattern formation technology. The miniaturization of the pattern requires highly expensive equipment. For this reason, although the integration degree of two-dimensional (2D) semiconductor devices is increasing, the degree to which the integration can increase is limited. Therefore, three-dimensional memory devices with memory cells that are arranged in three dimensions are suggested.

SUMMARY

In accordance with an embodiment of the present invention, a memory cell includes: a bit line and a plate line that are spaced apart from each other and vertically oriented in a first direction; a transistor including an active layer, the active layer being laterally oriented in a second direction intersecting with the bit line; a capacitor laterally oriented in the second direction between the active layer and the plate line; and a word line laterally oriented in a third direction intersecting with the bit line and the active layer, wherein the word line is embedded in the active layer.

In accordance with another embodiment of the present invention, a memory device includes: a memory cell array including a plurality of memory cells that are vertically arrayed in a first direction, wherein each of the memory cells includes a bit line and a plate line that are spaced apart from each other and vertically oriented in the first direction; a transistor including an active layer, the active layer being laterally oriented in a second direction intersecting with the bit line, wherein the transistor includes a first active cylinder, a second active cylinder, and a pair of plate portions that are laterally oriented between the first active cylinder and the second active cylinder; a word line laterally oriented in a third direction while penetrating between the pair of the plate portions of the active layer; and a capacitor laterally oriented in the second direction between the active layer and the plate line.

DETAILED DESCRIPTION

Figure 1:
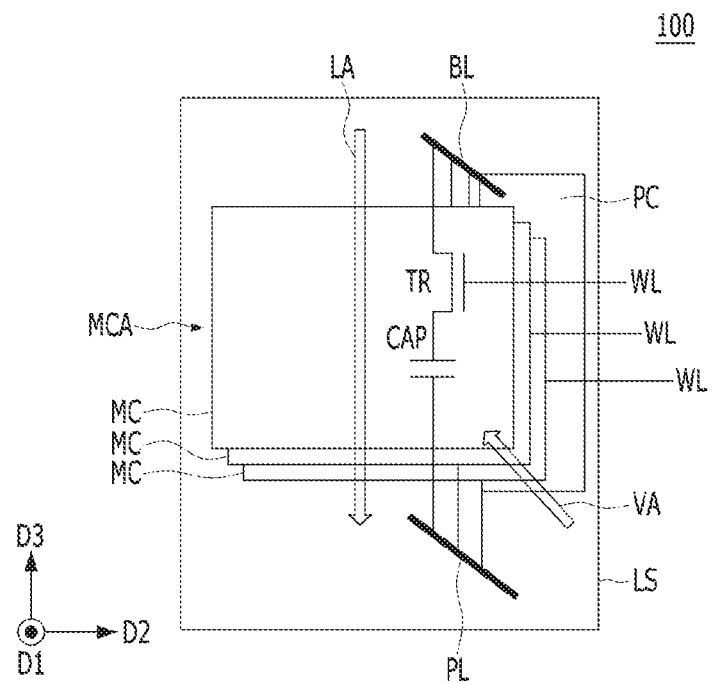
FIG. 1 schematically illustrates a structure of a memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments of the present invention are directed to a three-dimensional memory device with improved degree of integration.

The memory device according to the embodiments of the present invention may include a lateral active layer, a single word line WL, a vertical bit line BL, and a lateral capacitor.

Figure 2A:
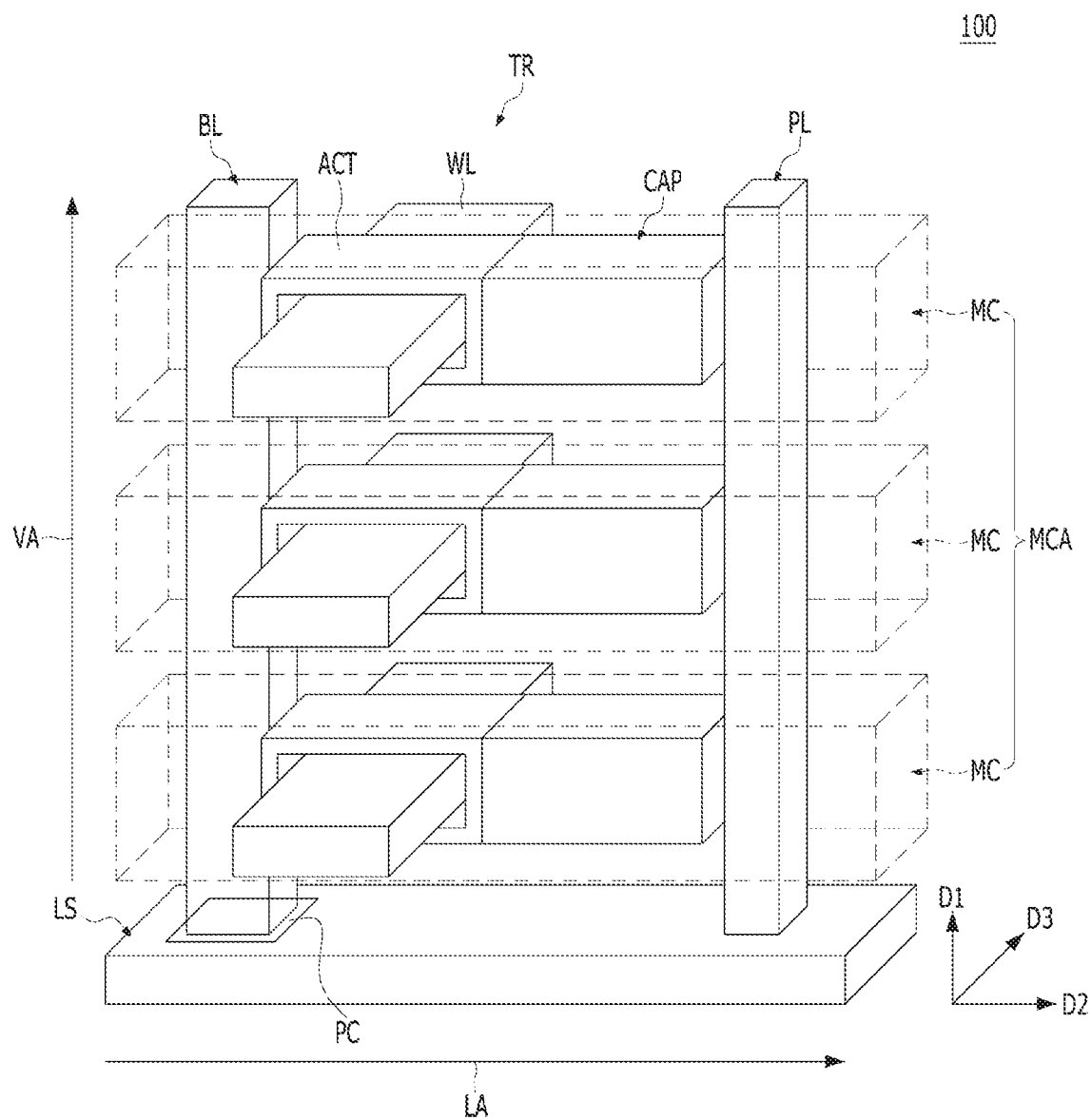
FIG. 2A is a perspective view illustrating the memory device.
Figure 2B:
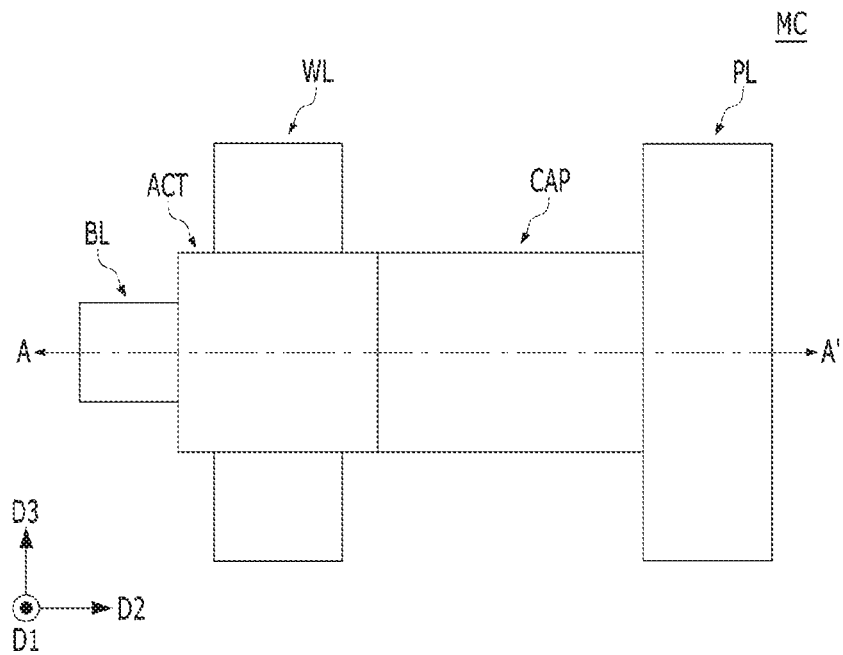
FIG. 2B is a plan view illustrating an individual memory cell.
Figure 2C:
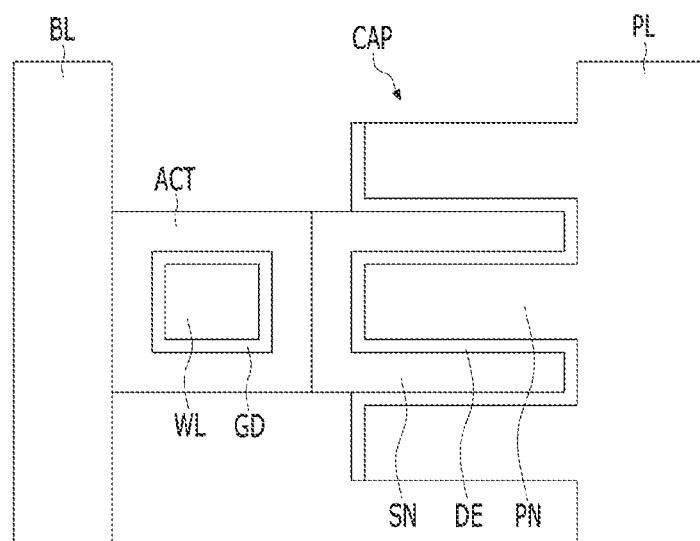
FIG. 2C is a cross-sectional view, taken along a line A-A', shown in FIG. 2B.
Figure 3A:
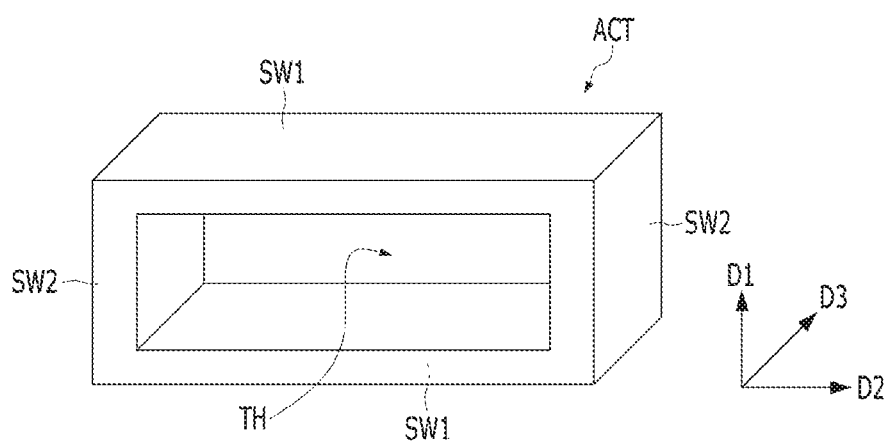
FIGS. 3A and 3B illustrate an active layer shown in FIG. 2B.
Figure 3B:
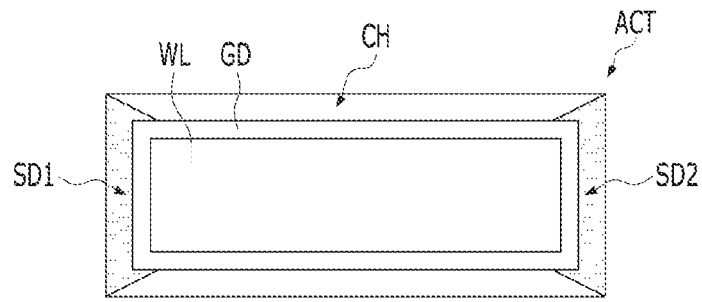
Figure 4:
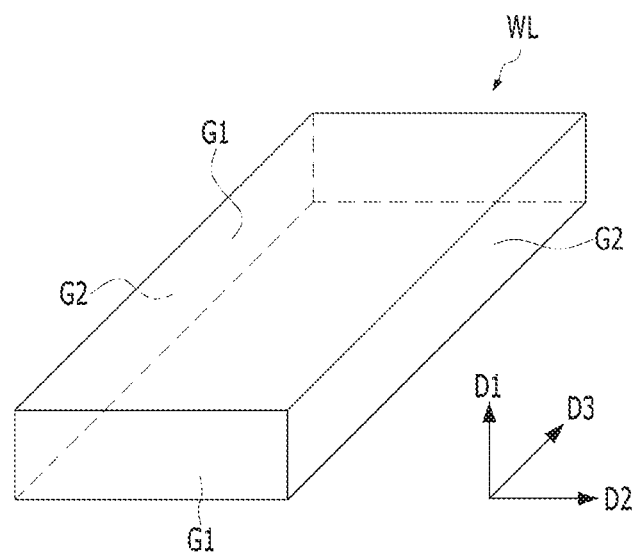
FIG. 4 is a perspective view, illustrating a word line, shown in FIG. 2B.
Figure 5:
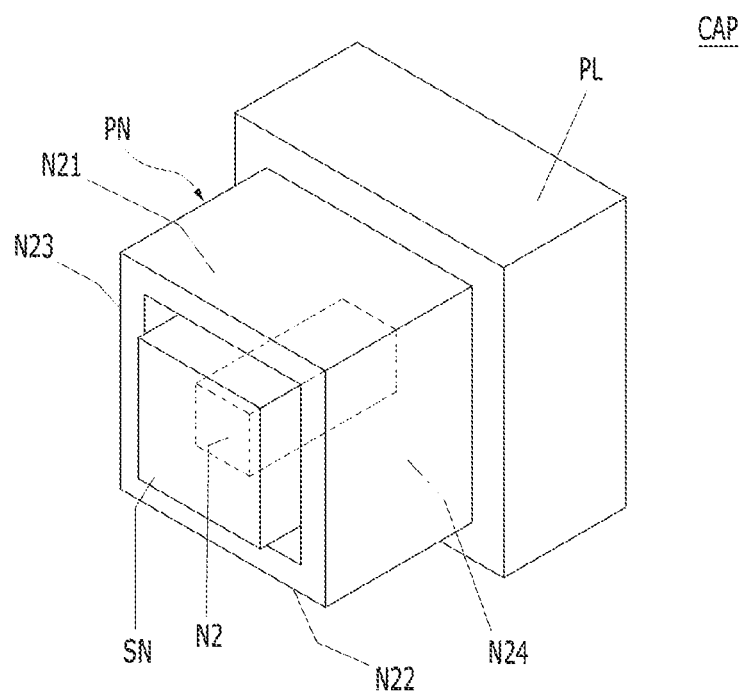
FIG. 5 is a perspective view, illustrating a capacitor and a plate line, shown in FIG. 2B.

FIG. 1 schematically illustrates a structure of a memory device in accordance with an embodiment of the present invention. FIG. 2A is a perspective view, illustrating the memory device, shown in FIG. 1. FIG. 2B is a plan view, illustrating an individual memory cell, shown in FIG. 2A. FIG. 2C is a cross-sectional view, taken along a line A-A', shown in FIG. 2B. FIGS. 3A and 3B illustrate an active layer that is shown in FIG. 2B. FIG. 4 is a perspective view, illustrating a word line, shown in FIG. 2B. FIG. 5 is a perspective view, illustrating a capacitor and a plate line, shown in FIG. 2B.

Referring to FIG. 1, the memory device 100 may include a base substrate LS, and a memory cell array MCA may be formed over the base substrate LS. The memory cell array MCA may be vertically arranged VA in a first direction D1 from the base substrate LS. The memory cell array MCA may include a plurality of memory cells MC, and each of the memory cells MC may include a bit line BL, a transistor TR, and a capacitor CAP, and a plate line PL. In each memory cell MC, the bit line BL, the transistor TR, the capacitor CAP, and the plate line PL may be positioned in a lateral arrangement LA in a second direction D2. Each memory cell MC may further include a word line WL, and the word line WL may extend in a third direction D3. The memory cell array MCA may include a DRAM memory cell array.

The base substrate LS may be of a material that is suitable for semiconductor processing. The base substrate LS may include at least one among a conductive material, a dielectric material, and a semiconductor material. Various materials may be formed over the base substrate LS. The base substrate LS may include a semiconductor substrate. The base substrate LS may be formed of a silicon-containing material. The base substrate LS may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The base substrate LS may include other semiconductor materials, such as germanium. The base substrate LS may include a group III/V semiconductor substrate (for example, a compound semiconductor substrate, such as GaAs). The base substrate LS may include a Silicon-On-Insulator (SOI) substrate.

According to another embodiment of the present invention, the base substrate LS may include a peripheral circuit unit PC. The peripheral circuit unit PC may include a plurality of control circuits to control the memory cell array MCA. At least one control circuit of the peripheral circuit unit PC may include an N-channel transistor, a P-channel transistor, a CMOS circuit, or a combination thereof. The at least one control circuit of the peripheral circuit unit PC may include an address decoder circuit, a read circuit, and a write circuit. The at least one control circuit of the peripheral circuit unit PC may include a planar channel transistor, a recess channel transistor, a buried gate transistor, a fin channel transistor (FinFET) and the like.

For example, the peripheral circuit unit PC may include a sense amplifier SA, and the sense amplifier SA may be coupled to a multi-level metal wire MLM.

Although not illustrated, the plate line PL may be coupled to another peripheral circuit unit PC, or it may be coupled to the base substrate LS through another multi-level metal wire.

The memory cell array MCA may include a stack of memory cells MC. The memory cells MC may be vertically stacked in the first direction D1 over the base substrate LS.

Referring to FIGS. 2A to 2C, each of the memory cells MC may include a bit line BL, a transistor TR, a capacitor CAP, and a plate line PL. The transistor TR may include an active layer ACT and a word line WL. The transistor TR may be positioned between the bit line BL and the capacitor CAP. The transistor TR may be positioned in a lateral arrangement LA in the second direction D2, which is parallel to the surface of the base substrate LS. In short, the transistor TR may be positioned laterally between the bit line BL and the capacitor CAP.

The bit line BL may extend vertically from the base substrate LS in the first direction D1. The plane of the base substrate LS may extend in the second direction D2, and the first direction D1 may be perpendicular to the second direction D2. The bit line BL may be vertically oriented with respect to the base substrate LS. The bottom portion of the bit line BL may be coupled to the peripheral circuit unit PC. The bit line BL may have a pillar-shape. The bit line BL may be referred to as a vertically oriented bit line or a pillar-type bit line. The bit line BL may include a conductive material. The bit line BL may include polysilicon, a metal, a metal nitride, a metal silicide, or a combination thereof. The vertically stacked memory cells MC may share one bit line BL. The bit line BL may include a silicon-base material, a metal-base material, or a combination thereof. The bit line BL may include polysilicon, titanium nitride, tungsten, or a combination thereof. For example, the bit line BL may include polysilicon that is doped with an N-type impurity or titanium nitride (TiN). The bit line BL may include a stack of titanium nitride and tungsten (TiN/W). The bit line BL may further include an ohmic contact layer, such as a metal silicide.

The transistor TR may include an active layer ACT, a gate dielectric layer GD, and a word line WL. The word line WL may extend in the third direction D3, and the active layer ACT may extend in the second direction D2. The third direction D3 may be a direction that is perpendicular to the first direction D1. The active layer ACT may be laterally arranged with respect to the bit line BL. The word line WL may have a shape that penetrates the active layer ACT. The word line WL may be an embedded word line that is positioned inside the active layer ACT.

Referring to FIGS. 3A and 3B, the active layer ACT may have a tube shape of a three-dimensional structure with a through portion TH. For example, it may have a three-dimensional structure with a portion that extends in the second direction D2 and a portion that extends in the third direction D3. The through portion TH of the active layer ACT may extend in the third direction D3, and the word line WL may be formed inside the through portion TH in the third direction D3. The active layer ACT may include a pair of first side walls SW1 and a pair of second side walls SW2. The pair of first side walls SW1 may extend in the second direction D2, in parallel with each other. The pair of second side walls SW2 may extend in the first direction D1, in parallel with each other. The through portion TH may be defined by the interior of the active layer ACT based on the combination of the first side walls SW1 and the second side walls SW2, and the through portion TH may extend in the third direction D3. A gate dielectric layer GD may be formed over the surface of the through portion TH. The pair of second side walls SW2 may be vertical side walls, and the pair of first side walls SW1 may be horizontal sidewalk.

The active layer ACT may include a semiconductor material, such as polysilicon. The active layer ACT may include a first source/drain region SD1, a second source/drain region SD2, and a pair of channel regions CH, the pair of channel regions CH being between the first source/drain region SD1 and the second source/drain region SD2. The channel regions CH may be formed inside the first side walls SW1. The channel regions CH may be of a plate shape that extends in the second direction D2, and the first and second source/drain regions SD1 and SD2 may be vertical side walls that extend in the first direction D1. The first source/drain area SD1 and the second source/drain area SD2 may be formed in the second side walls SW2. The active layer ACT may include doped polysilicon, undoped polysilicon, or amorphous silicon. The first source/drain region SD1 and the second source/drain region SD2 may be doped with an N-type impurity or a P-type impurity. The first source/drain region SD1 and the second source/drain region SD2 may be doped with an impurity of the same conductivity type. The first source/drain region SD1 and the second source/drain region SD2 may include arsenic (As), phosphorus (P), boron (B), indium (In), or at least one impurity selected from a combination thereof. In some embodiments of the present invention, the channel regions CH may be doped with a conductive impurity. According to another embodiment of the present invention, the first and second source/drain regions SD1 and SD2 might not be formed in the second side walls SW2, but may be formed over the second side walls SW2.

The word line WL may operate in close proximity to the channel region CH. The word line WL may include a metal, a metal mixture, a metal alloy, or a semiconductor material. In this embodiment of the present invention, illustrated above, the gate dielectric layer GD may be formed between the word line WL and the channel region CH. The gate dielectric layer GD may include silicon oxide, silicon nitride, a high-k material, a ferroelectric material, an anti-ferroelectric material, or a combination thereof. The gate dielectric layer GD may conformally cover the through portion TH of the active layer ACT.

Referring to FIG. 4, the word line WL may include a pair of first side walls G1 and a pair of second side walls G2. The pair of first side walls G1 may extend in the second direction D2, in parallel with each other. The pair of second side walls G2 may extend in the third direction D3, in parallel with each other. The first side walls G1 and the second side walls G2 may be surrounded by the through portion TH of the active layer ACT. For example, the through portion TH of the active layer ACT may surround the first side walls G1 and the second side walls G2 of the word line WL.

Referring back to FIGS. 2B and 2C, the capacitor CAP may be positioned laterally with respect to the active layer ACT. The capacitor CAP may laterally extend in the second direction D2. The capacitor CAP may include a storage node SN, a dielectric layer DE, and a plate node PN. The storage node SN, the dielectric layer DE, and the plate node PN may be laterally arranged in the second direction D2. The storage node SN may have a cylinder shape that is oriented laterally, and the plate node PN may extend toward the interior and the exterior of the storage node SN. The dielectric layer DE may be positioned to surround the interior walls of the storage node SN and partially surround the exterior walls of the storage node SN to also partially surround the plate node PN. The plate node PN may be coupled to the plate line PL. The plate node PN and the plate line PL may be integrated.

The capacitor CAP may include a metal-insulator-metal (MIM) capacitor. The storage node SN and the plate node PN may include a metal-base material. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material with a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer with two or more layers of the above-mentioned high-k materials.

The dielectric layer DE may be formed of zirconium (Zr)-base oxide. The dielectric layer DE may be a stack structure with zirconium oxide ($ZrO_2$). The stack structure with zirconium oxide ($ZrO_2$) may include a ZA ($ZrO_2$/$Al_2O_3$) stack or a ZAZ ($ZrO_2$/$Al_2O_3$/$ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as zirconium oxide ($ZrO_2$)-base layer. According to another embodiment of the present invention, the dielectric layer DE may be formed of hafnium (Hf)-base oxide. The dielectric layer DE may be a stack structure with hafnium oxide ($HfO_2$). The stack structure with hafnium oxide ($HfO_2$) may include an HA ($HfO_2$/$Al_2O_3$) stack or a HAH ($HfO_2$/$Al_2O_3$/$HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-base layer. In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$)). Accordingly, the dielectric layer DE may include a stack of a high-k material and a high band gap material with a larger band gap than the high-k material. The dielectric layer DE may include silicon oxide ($SiO_2$) as another high-band gap material, except aluminum oxide ($Al_2O_3$). The dielectric layer DE may include a high band gap material, thereby suppressing a current leakage. The high band gap material may be extremely thin. The high band gap material may be thinner than the high-k material. According to another embodiment of the present invention, the dielectric layer DE may include a laminated structure in which a high-k material and a high band gap material are alternately stacked. For example, ZAZA ($ZrO_2/Al_2O_3/ZrO_2/Al_2O_3$), ZAZAZ ($ZrO_2/Al_2O_3/ZrO_2/Al_2O_3/Z\ O_2$), HAHA ($HfO_2/Al_2O_3/HfO_2/Al_2O_3$) or HAHAH ($HfO_2/Al_2O_3/HfO_2/Al_2O_3/HfO_2$). In the laminated structure above, aluminum oxide ($Al_2O_3$) may be extremely thin.

According to another embodiment of the present invention, the dielectric layer DE may include a stack structure with zirconium oxide, hafnium oxide, and aluminum oxide, a laminate structure, or a mixed structure thereof.

According to another embodiment of the present invention, an interface control layer for improving current leakage may be further formed between the storage node SN and the dielectric layer DE. The interface control layer may include titanium oxide ($TiO_2$). The interface control layer may also be formed between the plate node PN and the dielectric layer DE.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may be titanium (Ti), titanium nitride (TiN), tantalum (Ta), tantalum nitride (TaN), tungsten (W), tungsten nitride (WN), ruthenium (Ru), ruthenium oxide ($RuO_2$), iridium ($IrO_2$), platinum (Pt), molybdenum (Mo), molybdenum oxide (MoO), a titanium nitride/tungsten (TiN/W) stack, and a tungsten nitride/tungsten (WN/W) stack. The plate node PN may include a combination of a metal-base material and a silicon-base material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, the silicon germanium may be a gap-fill material that fills the interior of the storage node SN, and titanium nitride (TiN) may be serve as a plate node of a substantial capacitor CAP, and tungsten nitride may be a low-resistance material.

The storage node SN has a three-dimensional structure, but the storage node SN of the three-dimensional structure may be a lateral three-dimensional structure that is parallel to the second direction D2. As an example of the three-dimensional structure, the storage node SN may have a cylinder shape, a pillar shape, or a cylinder shape in which the pillar shape and the cylinder shape are merged.

Referring to FIG. 5, the plate node PN of the capacitor CAP may include an internal node N2 and external nodes N21, N22, N23, and N24. The internal node N2 and the external nodes N21, N22, N23, and N24 may be coupled to each other. The internal node N2 and the external nodes N21, N22, N23, and N24 may be coupled to the plate line PL. The internal node N2 may be positioned in the interior of the storage node SN. The external nodes N21, N22, N23, and N24 may be positioned in the outside of the storage node SN. The internal node N2 may be positioned in the interior of the storage node SN. The external nodes N21, N22, N23, and N24 may be positioned to surround the cylinder external wall of the storage node SN. The external nodes N21, N22, N23, and N24 may be in continuum.

Figure 6:
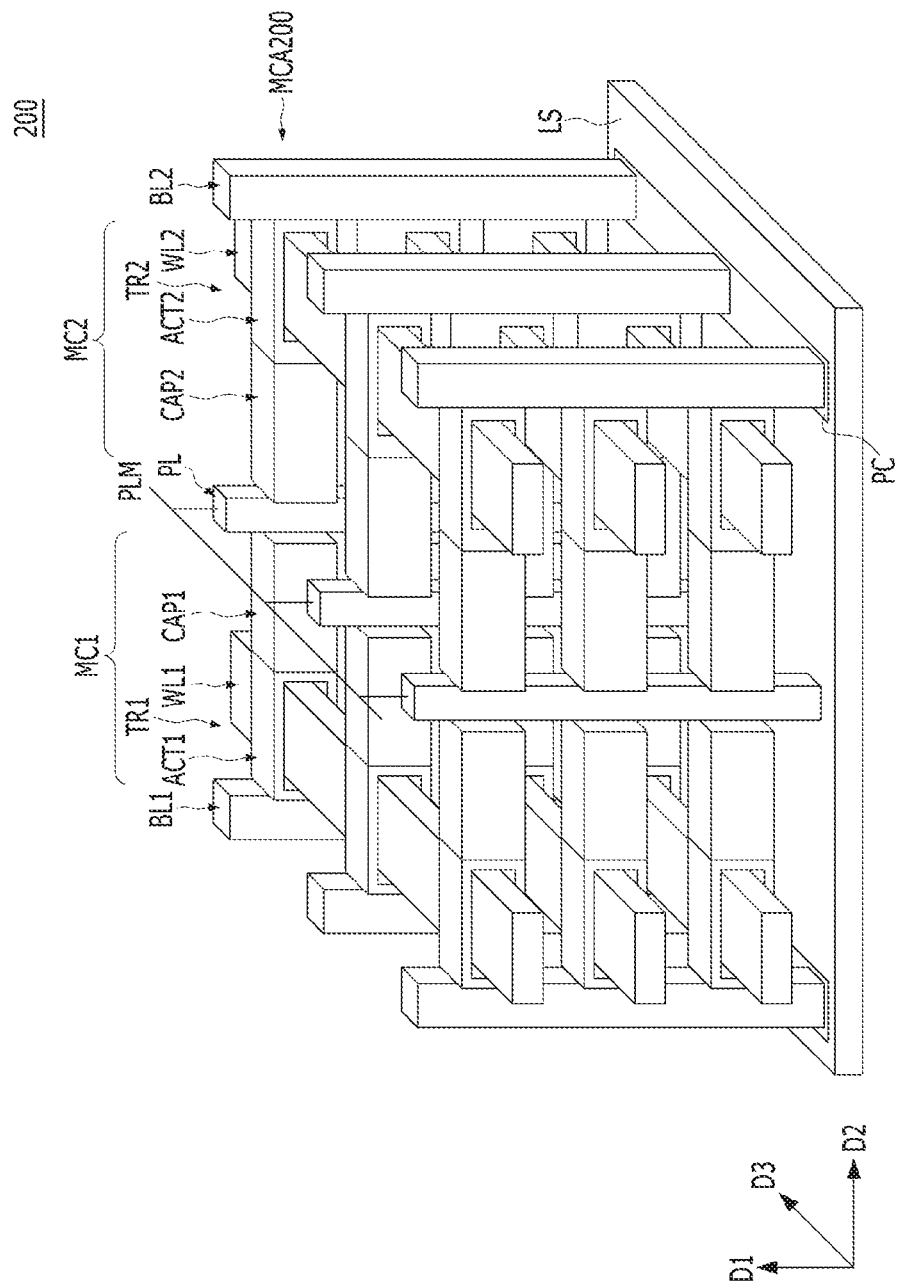
FIG. 6 is a perspective view, illustrating a mirror-type memory device, sharing a plate line.
Figure 7:
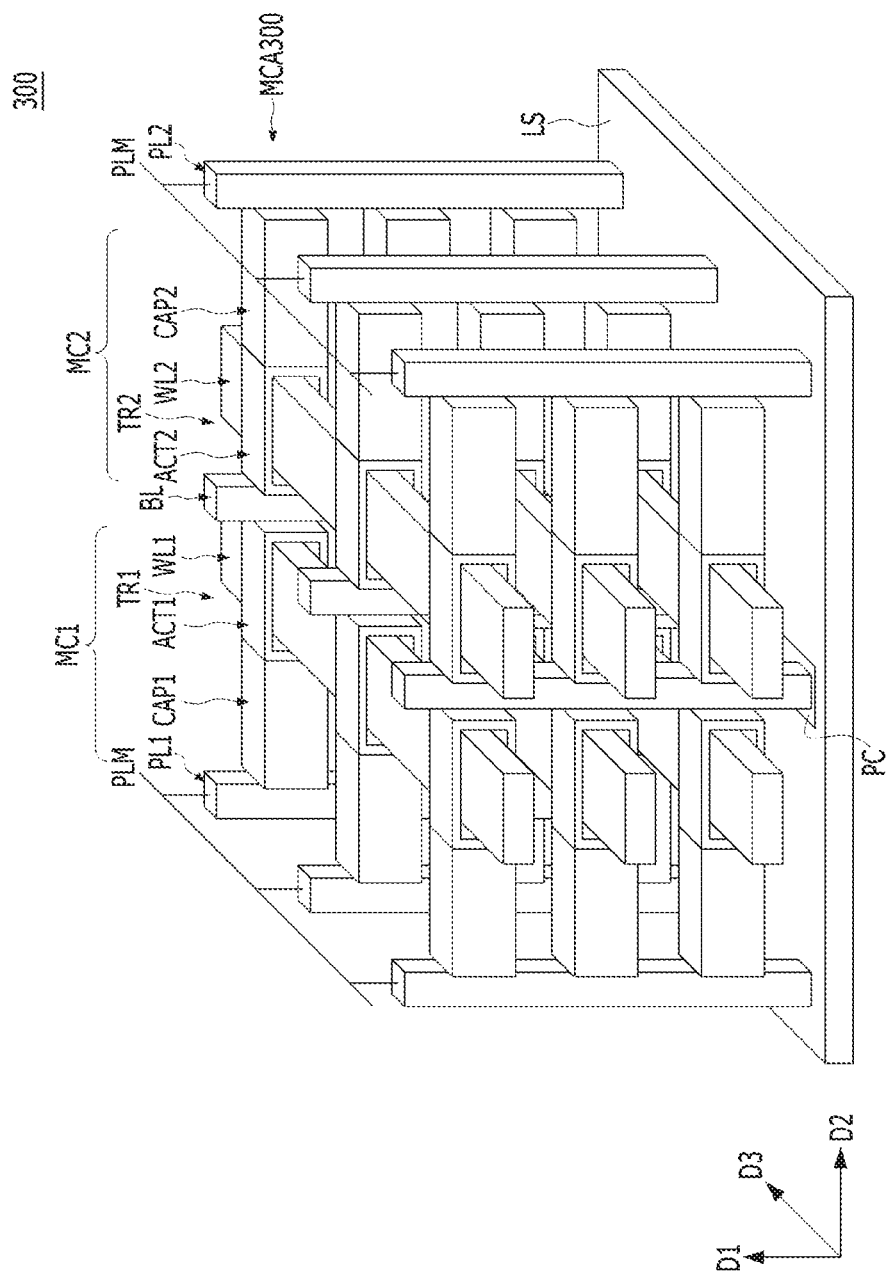
FIG. 7 is a perspective view, illustrating a mirror-type memory device, sharing a bit line.

FIG. 6 is a perspective view illustrating a mirror-type memory device sharing a plate line. FIG. 7 is a perspective view illustrating a mirror-type memory device sharing a bit line.

Referring to FIG. 6, a mirror-type structure 200 sharing the plate line PL is described. The mirror-type structure 200 may include a memory cell array MCA and memory cells MC shown in FIG. 2A.

Referring to FIG. 6, one memory cell array MCA200 may include two memory cells MC1 and MC2. A plurality of memory cell arrays MCA200 may be vertically stacked in the first direction D1. The memory cell arrays MCA200 may be laterally arranged in the third direction D3.

The memory cell MC1 may include a bit line BL1 that is vertically oriented with respect to the base substrate LS in the first direction D1, a transistor TR1 with an active layer ACT1 that is coupled to the bit line BL1 and laterally oriented in the second direction D2 intersecting with the bit line BL1, a capacitor CAP1 that is coupled to the active layer ACT1 and laterally oriented with respect to the active layer ACT1, and a plate line PL that is coupled to the capacitor CAP1 and vertically oriented in the first direction D1. The transistor TR1 may be laterally oriented in the second direction D2 intersecting with the bit line BL1 and the active layer ACT1, and may include a word line WL1 that is embedded in the active layer ACT1. The word line WL1 may penetrate the active layer ACT1 and may extend in the third direction D3, and a gate dielectric layer (not shown) may be formed between the word line WL1 and the active layer ACT1. The bit line BL1 may be coupled to the peripheral circuit unit PC of the base substrate LS.

The memory cell MC2 may include a bit line BL2 that is vertically oriented with respect to the base substrate LS in the first direction D1, a transistor TR2 with an active layer ACT2 that is coupled to the bit line BL2 and laterally oriented in the second direction D2 intersecting with the bit line BL2, a capacitor CAP2 that is coupled to the active layer ACT2 and laterally oriented with respect to the active layer ACT2, and a plate line PL that is coupled to the capacitor CAP2 and vertically oriented in the first direction D1. The transistor TR2 may be laterally oriented in the second direction D2 intersecting with the bit line BL2 and the active layer ACT2 and may include a word line WL2 that is embedded in the active layer ACT2. The word line WL2 may penetrate the active layer ACT2 and may extend in the third direction D3, and a gate dielectric layer (not shown) may be formed between the word line WL2 and the active layer ACT2. The bit line BL2 may be coupled to the peripheral circuit unit PC of the base substrate LS.

The memory cells MC1 and MC2 may share one plate line PL. Plate lines PL may be coupled to each other through a common wire PLM. The plate lines PL might not be coupled to the peripheral circuit unit PC. According to another embodiment of the present invention, the common wire PLM for coupling the plate lines PL may be provided between the peripheral circuit unit PC and the plate lines PL. According to another embodiment of the present invention, the plate lines PL may be coupled to each other to have an integrated structure.

The memory cells MC1 and MC2 may be arranged in a mirror-type structure that shares one plate line PL while being coupled to different bit lines BL1 and BL2. The memory cells MC1 and MC2 of the same level may be laterally arranged in the second direction D2, which is parallel to the base substrate LS. Memory cell arrays MCA200 of the same level may be arranged in the third direction D3. Memory cell arrays MCA200 of different levels may be vertically arranged in the first direction D1, which is perpendicular to the base substrate LS.

Referring to FIG. 7, a mirror-type structure 300 sharing a bit line will be described. The mirror-type structure 300 may include the memory cell array MCA and the memory cells MC, shown in FIG. 2A.

Referring to FIG. 7, one memory cell array among the memory cell arrays MCA300 may include two memory cells MC1 and MC2. The memory cell arrays MCA300 may be vertically stacked in the first direction D1. The memory cell arrays MCA300 may be laterally arranged in the third direction D3.

The memory cell MC1 may include a bit line BL that is vertically oriented with respect to the base substrate LS in the first direction D1, a transistor TR1 with an active layer ACT1 that is coupled to the bit line BL and laterally oriented in the second direction D2 intersecting with the bit line BL, a capacitor CAP1 that is coupled to an active layer ACT1 and laterally oriented with respect to the active layer ACT1, and a plate line PL1 that is coupled to the capacitor CAP1 and vertically oriented in the first direction D1. The transistor TR1 may be laterally oriented in the second direction D2, intersecting with the bit line BL and the active layer ACT1, and may include a word line WL1 embedded in the active layer ACT1. The word line WL1 may penetrate the active layer ACT1 and may extend in the third direction D3, and a gate dielectric layer (not shown) may be formed between the word line WL1 and the active layer ACT1. The bit line BL may be coupled to the peripheral circuit unit PC of the base substrate LS.

The memory cell MC2 may include a bit line BL that is vertically oriented with respect to the base substrate LS in the first direction D1, a transistor TR2 with an active layer ACT2 that is coupled to the bit line BL2 and laterally oriented in the second direction D2 intersecting with the bit line BL, a capacitor CAP2 that is coupled to the active layer ACT2 and laterally oriented with respect to the active layer ACT2, and a plate line PL that is coupled to the capacitor CAP2 and vertically oriented in the first direction D1. The transistor TR2 may be laterally oriented in the second direction D2 intersecting with the bit line BL and the active layer ACT2 and may include a word line WL2 that is embedded in the active layer ACT2. The word line WL2 may penetrate the active layer ACT2 and may extend in the third direction D3, and a gate dielectric layer (not shown) may be formed between the word line WL2 and the active layer ACT2. The bit line BL may be coupled to the peripheral circuit unit PC of the base substrate LS.

The memory cells MC1 and MC2 may share one plate line PL. A plate line PL1 that is coupled to the memory cell MC1 may be coupled to a common wire PLM. A plate line PL2 that is coupled to the memory cell MC2 may be coupled to the common wire PLM. The plate lines PL1 and PL2 might not be coupled to the peripheral circuit unit PC. According to another embodiment of the present invention, the common wire PLM coupled to the plate lines PL1 and PL2 may be provided between the peripheral circuit unit PC and the plate lines PL1 and PL2. According to another embodiment of the present invention, the plate lines PL1 and PL2 may be coupled to each other to have an integrated structure.

The memory cells MC1 and MC2 may be arranged in a mirror-type structure that shares one bit line BL while being coupled to different plate lines PL1 and PL2. The memory cells MC1 and MC2 of the same level may be laterally arranged in the second direction D2, which is parallel to the base substrate LS. Memory cell arrays MCA300 of the same level may be arranged in the third direction D3. Memory cell arrays MCA300 of different levels may be vertically arranged in the first direction D1, which is perpendicular to the base substrate LS.

According to another embodiment of the present invention, the memory devices 200 and 300, illustrated in FIGS. 6 and 7, may have a mirror-type structure 200 that shares a plate line PL and a mirror-type structure 300 sharing a bit line BL.

Figure 8A:
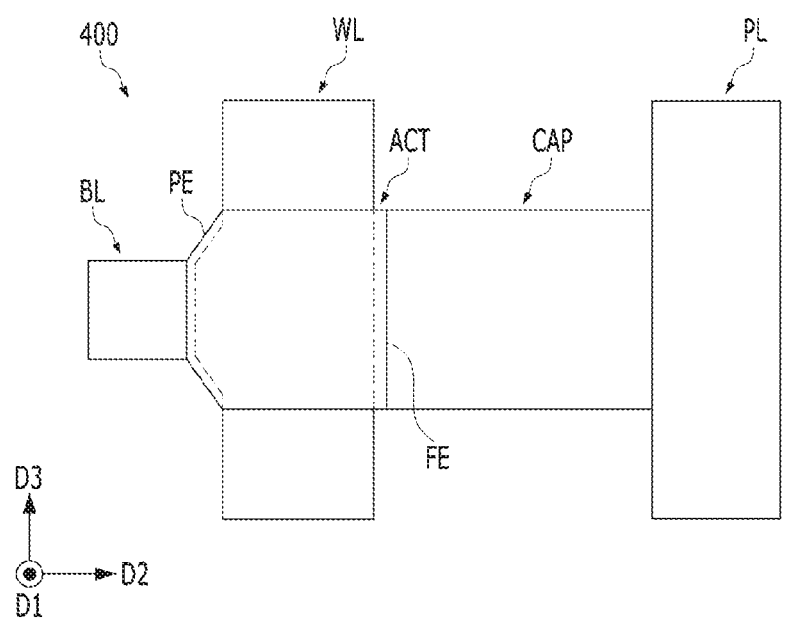
FIGS. 8A and 8B are plan views, illustrating a memory cell, in accordance with another embodiment of the present invention.
Figure 8B:
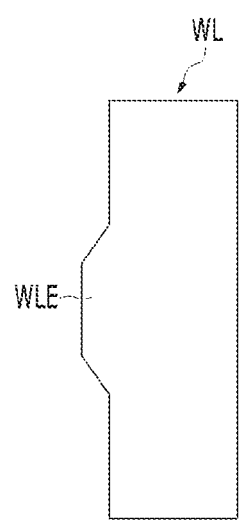

FIGS. 8A and 8B are plan views, illustrating a memory cell, in accordance with another embodiment of the present invention. FIG. 8A is a plan view, illustrating the memory cell, and FIG. 8B is a plan view, illustrating the word line, shown in FIG. 8A.

Referring to FIGS. 8A and 8B, the memory cell 400 may include a bit line BL that is vertically oriented in the first direction D1, an active layer ACT that is coupled to the bit line BL and laterally oriented in the second direction D2 intersecting with the bit line BL, a capacitor CAP that is coupled to the active layer ACT and laterally oriented with respect to the active layer ACT, and a plate line PL that is coupled to the capacitor CAP and vertically oriented in the first direction D1. The memory cell 400 may include a word line WL, and the word line WL may be laterally oriented in the third direction D3 intersecting with the bit line BL and the active layer ACT. The word line WL may be embedded in the active layer ACT. The word line WL may penetrate the active layer ACT and may extend in the third direction D3.

The active layer ACT may include a protruding edge PE at a portion close to the bit line BL. The word line WL may include a protruding side portion WLE, close to the bit line BL, due to the protruding edge PE of the active layer ACT. The active layer ACT may further include a flat edge FE that is close to the capacitor CAP.

Figure 9A:
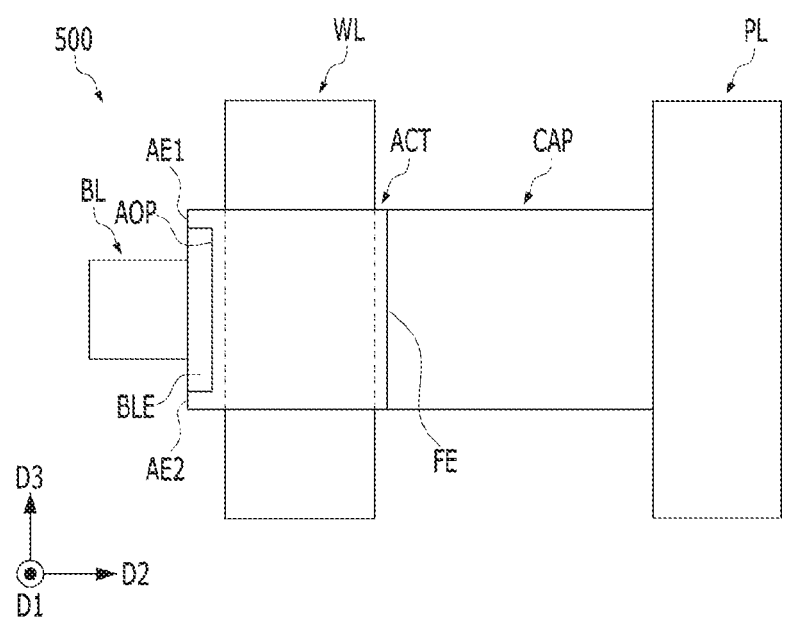
FIGS. 9A to 9C illustrate a memory cell in accordance with another embodiment of the present invention.
Figure 9B:
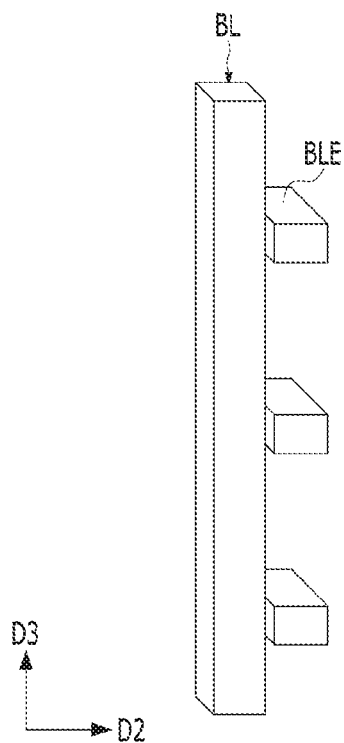
Figure 9C:
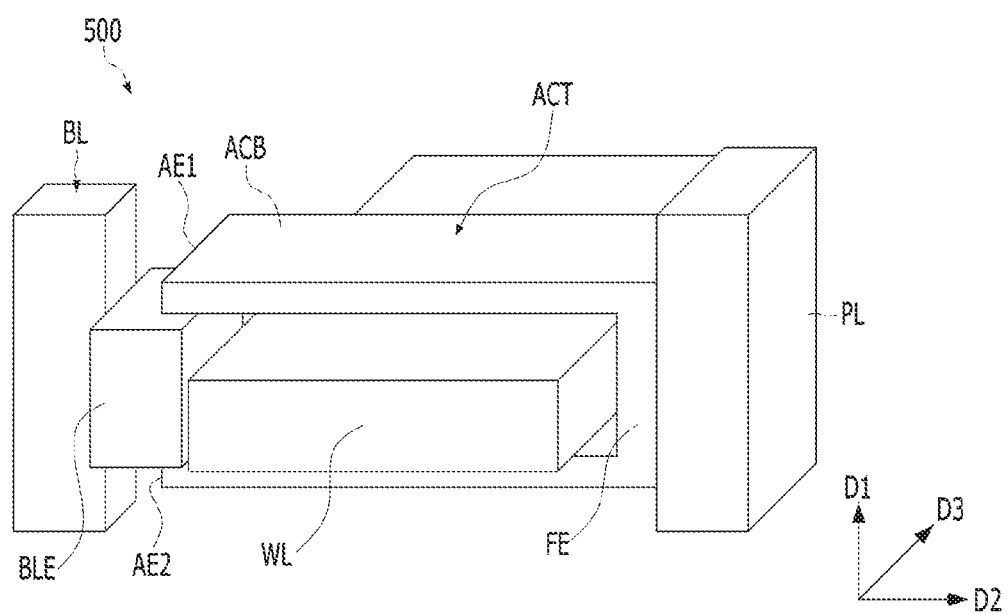

FIGS. 9A to 9C illustrate a memory cell 500 in accordance with another embodiment of the present invention. FIG. 9A is a plan view of a memory cell in accordance with another embodiment of the present invention, FIG. 9B is a detailed view of a bit line, and FIG. 9C is a perspective view of the memory cell.

Referring to FIGS. 9A to 9C, the memory cell 500 may include a bit line BL that is vertically oriented in the first direction D1, an active layer ACT that is coupled to the bit line BL and laterally oriented in the second direction D2 intersecting with the bit line BL, a capacitor CAP that is coupled to the active layer ACT and laterally oriented with respect to the active layer ACT, and a plate line PL that is coupled to the capacitor CAP and vertically oriented in the first direction D1. The memory cell 500 may include a word line WL that is laterally oriented in the third direction D3, intersecting with the bit line BL and the active layer ACT, and embedded in the active layer ACT. The word line WL may penetrate the active layer ACT.

The active layer ACT may include cut-type edges AE1 and AE2 that provide an open portion AOP at a portion close to the bit line BL. An embedded side portion BLE of the bit line BL may be positioned in the open portion AOP of the active layer ACT. The embedded side portion BLE may be a portion that extends laterally from the bit line BL in the second direction D2. The active layer ACT may include a cap-shaped body ACB, and the cap-shaped body ACB may have a shape that surrounds a portion of the word line WL. One side of the cap-shaped body ACB may be cut to form an open portion AOP, and the open portion AOP may be defined between the cut-type edges AE1 and AE2. Accordingly, an open side wall may be provided by the cut-type edges AE1 and AE2, and the embedded side portion BLE of the bit line BL may be extended and positioned in an off-type side wall. The cut-type edges AE1 and AE2 of the active layer ACT may be coupled to the embedded side portion BLE of the bit line BL. Another side of the cap-shaped body ACB may include a flat edge FE, and the flat edge FE may be coupled to the capacitor CAP. The bit line BL and the embedded side portion BLE may include a metal-containing material. According to another embodiment of the present invention, the bit line BL may include a metal-containing material, and the embedded side portion BLE of the bit line BL may include polysilicon that is doped with an impurity.

Figure 10A:
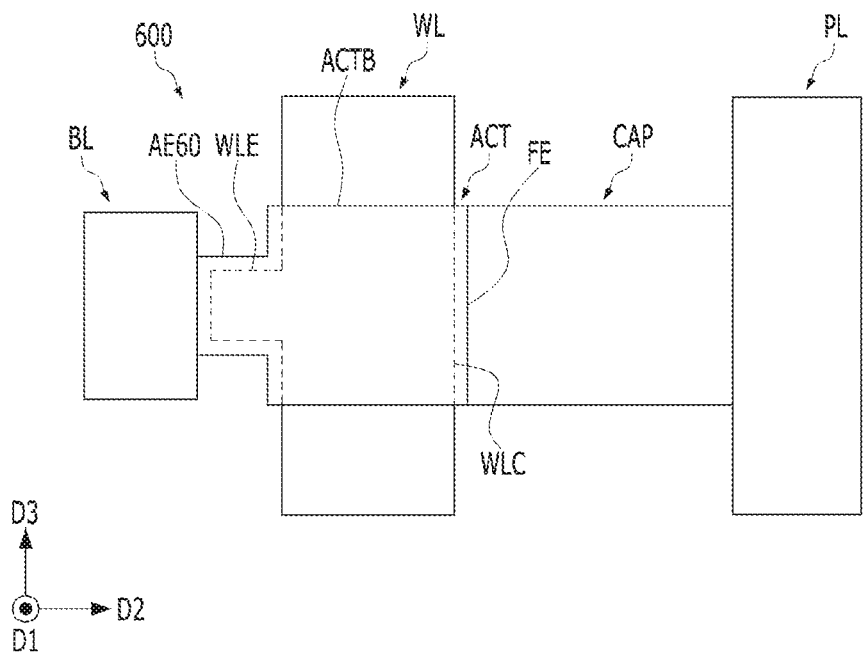
FIGS. 10A and 10B illustrate a memory cell in accordance with another embodiment of the present invention.
Figure 10B:
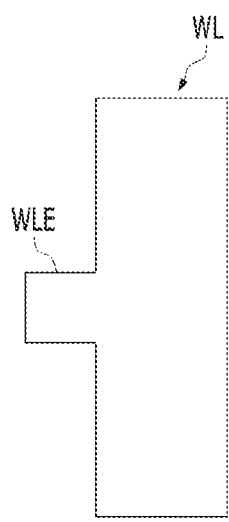

FIGS. 10A and 10B illustrate a memory cell 600 in accordance with another embodiment of the present invention. FIG. 10A is a plan view of the memory cell 600, and FIG. 10B is a cross-sectional view of a word line.

Referring to FIGS. 10A and 10B, the memory cell 600 may include a bit line BL that is vertically oriented in the first direction D1, an active layer ACT that is coupled to the bit line BL and laterally oriented in the second direction D2 intersecting with the bit line BL, a capacitor CAP that is coupled to the active layer ACT and laterally oriented with respect to the active layer ACT, and a plate line PL that is coupled to the capacitor CAP and vertically oriented in the first direction D1. The memory cell 600 may include a word line WL that is laterally oriented in the third direction D3, intersecting with the bit line BL and the active layer ACT, and embedded in the active layer ACT. The word line WL may penetrate the active layer ACT.

The active layer ACT may include a body portion ACTB, a protruding edge AE60, and a flat edge FE. The protruding edge AE60 of the active layer ACT may be coupled to the bit line BL, and the flat edge FE of the active layer ACT may be coupled to the capacitor CAP. Each of the protruding edge AE60 and the flat edge FE of the active layer ACT may include vertical side walls that extend in the first direction D1. According to another embodiment of the present invention, the flat edge FE may include vertical side walls, and the protruding edge AE60 may include an open portion (see AOP in FIG. 9A). The protruding edge AE60 with an open portion may include edges AE1 and AE2 as shown in FIG. 9A. The length of the body portion ACTB in the third direction D3 may be longer than the length of the protruding edge AE60 in the third direction D3.

The word line WL may include a line portion WLC and a laterally extended portion WLE. The line portion WLC of the word line WL may penetrate the body portion ACTB of the active layer ACT. The laterally extended portion WLE of the word line WL may be formed in the protruding edge AE60 of the active layer ACT.

According to another embodiment of the present invention, the protruding edge AE60 of the active layer ACT may have a cylinder shape with an empty space inside, and the laterally extended portion WLE of the word line WL may extend into the interior of the protruding edge AE60 to be buried. As for the cylinder shape of the protruding edge AE60, FIGS. 13A, 13B, 15A, and 15B may be referred to.

Figure 11A:
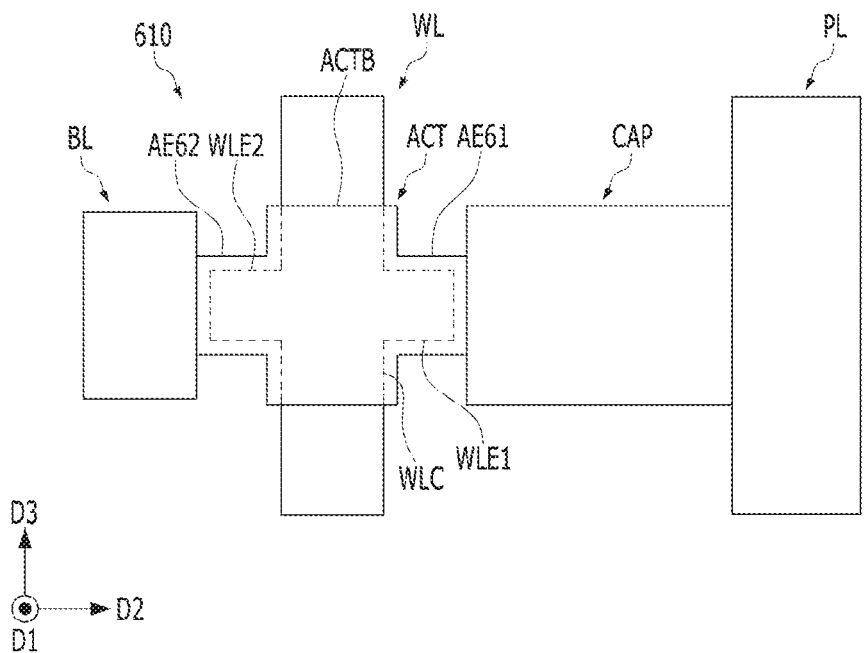
FIGS. 11A and 11B illustrate a memory cell in accordance with another embodiment of the present invention.
Figure 11B:
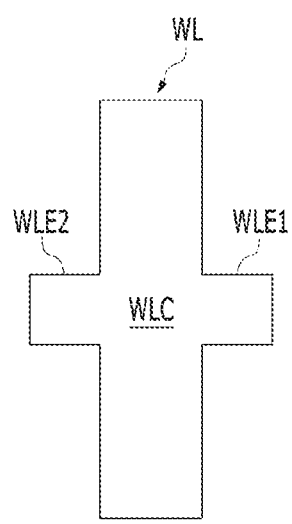

FIGS. 11A and 11B illustrate a memory cell 610 in accordance with another embodiment of the present invention. FIG. 11A is a cross-sectional view of the memory cell 610, and FIG. 11B is a cross-sectional view of a word line.

Referring to FIGS. 11A and 11B, the memory cell 610 may include a bit line BL that is vertically oriented in the first direction D1, an active layer ACT that is coupled to the bit line BL and laterally oriented in the second direction D2 intersecting with the bit line BL, a capacitor CAP that is coupled to the active layer ACT and laterally oriented with respect to the active layer ACT, and a plate line PL that is coupled to the capacitor CAP and vertically oriented in the first direction D1. The memory cell 610 may include a word line WL that is laterally oriented in the third direction D3, intersecting with the bit line BL and the active layer ACT, and embedded in the active layer ACT. The word line WL may penetrate the active layer ACT.

The active layer ACT may include a body portion ACTB, a first protruding edge AE61, and a second protruding edge AE62. The first protruding edge AE61 of the active layer ACT may be close to the capacitor CAP, and the second protruding edge AE62 of the active layer ACT may be close to the bit line BL. Each of the first protruding edge AE61 and the second protruding edge AE62 of the active layer ACT may include vertical side walls that extend in the first direction D1. According to another embodiment of the present invention, the first protruding edge AE61 may include vertical side walls, and the second protruding edge AE62 may include an open portion (see AOP in FIG. 9A). The second protruding edge AE62 with an open portion may include edges AE1 and AE2 as shown in FIG. 9A. The length of the body portion ACTB in the third direction D3 may be longer than the lengths of the first protruding edge AE61 and the second protruding edge AE62 in the third direction D3.

The word line WL may include a line portion WLC, a first laterally extended portion WLE1, and a second laterally extended portion WLE2. The line portion WLC of the word line WL may penetrate the body portion ACTB of the active layer ACT. The first laterally extended portion WLE1 of the word line WL may be formed in the first protruding edge AE61 of the active layer ACT. The second laterally extended portion WLE2 of the word line WL may be formed in the second protruding edge AE62 of the active layer ACT.

According to another embodiment of the present invention, the first protruding edge AE61 and the second protruding edge AE62 of the active layer ACT may have a cylinder shape with an empty space inside, and the first and second laterally extended portions WLE1 and WLE2 of the word line WL may extend into the interiors of the first and second laterally extended portions WLE1 and WLE2 to be buried. As for the cylinder shapes of the first and second laterally extended portions WLE1 and WLE2, FIGS. 13A, 13B, 15A, and 15B may be referred to.

Figure 12:
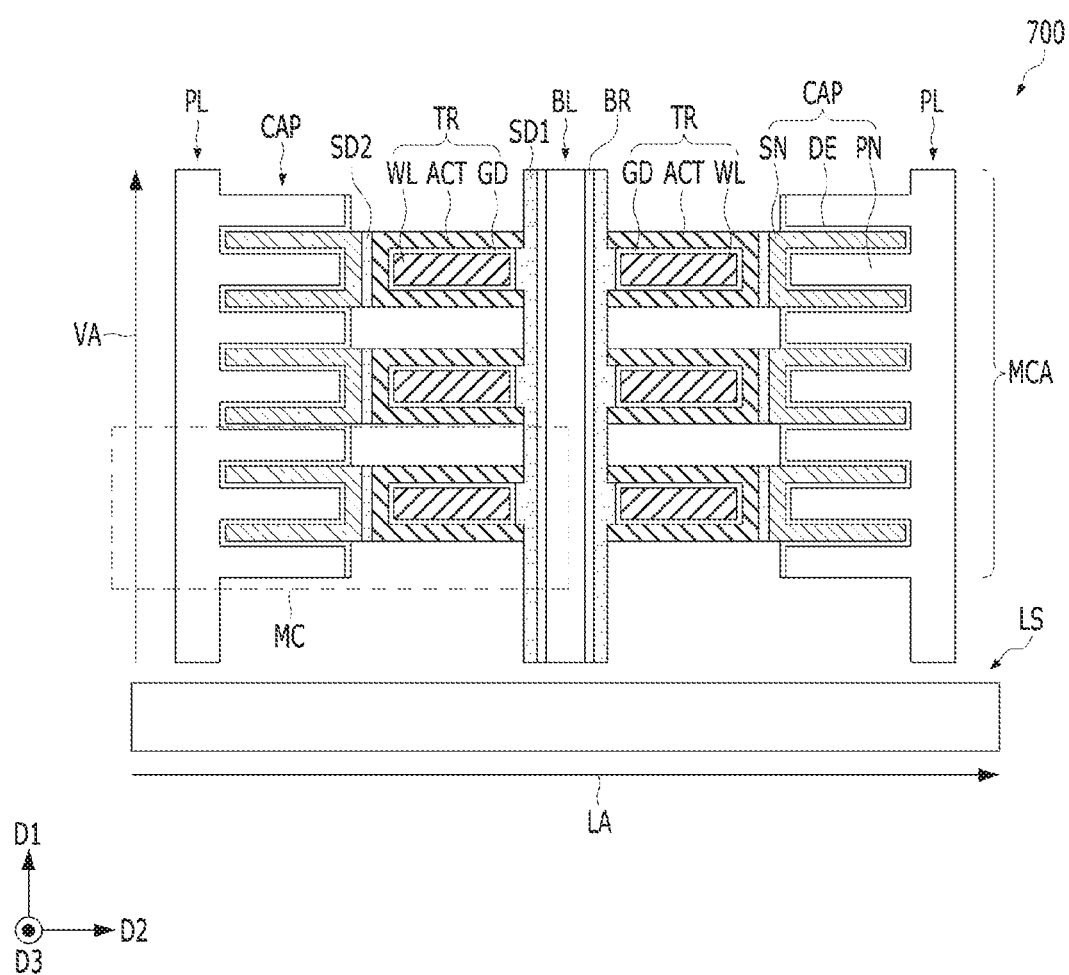
FIG. 12 is a plan view, schematically illustrating a structure of a memory device, in accordance with another embodiment of the present invention.

FIG. 12 is a plan view, schematically illustrating a structure of a memory device 700, in accordance with another embodiment of the present invention.

Referring to FIG. 12, the memory device 700 may include a base substrate LS, and a memory cell array MCA may be formed over the base substrate LS. The memory cell array MCA may be vertically arranged VA in the first direction D1 from the base substrate LS. The memory cell array MCA may include a plurality of memory cells MC, and the individual memory cells MC may include a bit line BL, a transistor TR, a capacitor CAP and a plate line PL. In each of the memory cells MC, the bit line BL, the transistor TR, the capacitor CAP, and the plate line PL may be positioned in a lateral arrangement LA in the second direction D2. Each memory cell MC may further include a word line WL, and the word line WL may extend in the third direction D3. The memory device 700 is illustrated to have a mirror-type structure sharing a bit line BL. According to another embodiment of the present invention, the memory device 700 may have a mirror-type structure that shares the plate line PL.

The base substrate LS may be of a material that is suitable for semiconductor processing. The base substrate LS may include at least one among a conductive material, a dielectric material, and a semiconductor material. Various materials may be formed over the base substrate LS. The base substrate LS may include a semiconductor substrate. The base substrate LS may be formed of a silicon-containing material. The base substrate LS may include silicon, monocrystalline silicon, polysilicon, amorphous silicon, silicon germanium, monocrystalline silicon germanium, polycrystalline silicon germanium, carbon-doped silicon, combinations thereof, or multi-layers thereof. The base substrate LS may include other semiconductor materials, such as germanium. The base substrate LS may include a group-III/V semiconductor substrate, for example, a compound semiconductor substrate, such as GaAs. The base substrate LS may include a silicon on insulator (SOI) substrate. According to another embodiment of the present invention, the base substrate LS may include a peripheral circuit unit PC. The peripheral circuit unit PC may include a plurality of control circuits to control a memory cell array MCA. The bit line BL may be coupled to a peripheral circuit unit PC.

The memory cell array MCA may include a stack of memory cells MC. The memory cells MC may be vertically stacked in the first direction D1 over the base substrate LS.

Each of the memory cells MC may include a bit line BL, a transistor TR, a capacitor CAP, and a plate line PL. The transistor TR may include an active layer ACT and a word line WL. The transistor TR may be positioned between the bit line BL and the capacitor CAP. The transistor TR may be positioned in a lateral arrangement LA in the second direction D2, which is parallel to the surface of the base substrate LS. In short, the transistor TR may be positioned laterally between the bit line BL and the capacitor CAP.

The bit line BL may extend vertically from the base substrate LS in the first direction D1. The plane of the base substrate LS may extend in the second direction D3, and the first direction D1 may be perpendicular to the second direction D2. The bit line BL may be vertically oriented with respect to the base substrate LS. The bit line BL may have a pillar shape. The bit line BL may be referred to as a vertically oriented bit line or a pillar-type bit line. The bit line BL may include a conductive material. The bit line BL may include polysilicon, a metal, a metal nitride, a metal silicide, or a combination thereof. The vertically stacked memory cells MC may share one bit line BL. The bit line BL and the plate line PL may be spaced apart from each other and may be vertically oriented in the first direction D1.

The transistor TR may include an active layer ACT, a gate dielectric layer GD, and a word line WL. The word line WL may extend in the third direction D3, and the active layer ACT may extend in the second direction D2. The third direction D3 may be a direction that is perpendicular to the first direction D1. The active layer ACT may be arranged laterally with respect to the bit line BL. The word line WL may have a shape penetrating the active layer ACT. The word line WL may be an embedded word line that is embedded inside the active layer ACT. The active layer ACT may have a 'C' shaped tubular structure with one side wall that is opened and penetrated by the word line WL. Herein, the open side wall of the active layer ACT may be close to the bit line BL. The active layer ACT may be formed separately on the basis of a memory cell MC.

The transistor TR may further include a first source/drain region SD1 and a second source/drain region SD2. The first source/drain region SD1 may be positioned between one side of the active layer ACT and the bit line BL. The second source/drain region SD2 may be positioned between another side of the active layer ACT and the capacitor CAP. The first source/drain region SD1 may be coupled to the bit line BL, and the second source/drain region SD2 may be coupled to the capacitor CAP. The first source/drain region SD1 may extend vertically in the first direction D1 while filling one open side of the active layer ACT. The memory cells MC that are vertically stacked may share the first source/drain region SD1. The second source/drain region SD2 may include a material which is selectively grown on another side wall of the active layer ACT. The second source/drain region SD2 may be formed separately from each other in each memory cell MC. The first source/drain region SD1 and the second source/drain region SD2 may include polysilicon doped with an N-type impurity. The first source/drain region SD1 may be formed by the deposition of a polysilicon layer and the impurity doping. The second source/drain region SD2 may be formed by the epitaxial growth of the polysilicon layer and the impurity doping. A portion of the first source/drain region SD1 may fill the open side wall of the active layer ACT. The first source/drain region SD1 may extend vertically in the first direction D1.

The capacitor CAP may be positioned laterally with respect to the transistor TR. The capacitor CAP may laterally extend in the second direction D2. The capacitor CAP may include a storage node SN, a dielectric layer DE, and a plate node PN. The storage node SN, the dielectric layer DE, and the plate node PN may be laterally arranged in the second direction D2. The storage node SN may have a laterally oriented cylinder shape, and the plate node PN may be of a shape extending into the cylindrical inside of the storage node SN. The dielectric layer DE may be positioned inside the storage node SN while surrounding the plate node PN. The plate node PN may be coupled to the plate line PL. The plate node PN and the plate line PL may be integrated. The plate node PN may include an internal node and a plurality of external nodes as shown in FIG. 5.

The capacitor CAP may include a Metal-Insulator-Metal (MIM) capacitor. The storage node SN and the plate node PN may include a metal-base material. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer (DE) may include a high-k material with a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer with two or more layers of the high-k materials mentioned above.

The dielectric layer DE may be formed of zirconium (Zr)-base oxide. The dielectric layer DE may be a stack structure with zirconium oxide ($ZrO_2$). The stack structure with zirconium oxide ($ZrO_2$) may include a ZA ($ZrO_2$/$Al_2O_3$) stack or a ZAZ ($ZrO_2$/$Al_2O_3$/$ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-base layer. According to another embodiment of the present invention, the dielectric layer DE may be formed of hafnium (Hf)-base oxide. The dielectric layer DE may be a stack structure with hafnium oxide (HfO$_2$). The stack structure with hafnium oxide (HfO$_2$) may include an HA (HfO$_2$/Al$_2$O$_3$) stack or a HAH (HfO$_2$/Al$_2$O$_3$/HfO$_2$) stack. The HA stack may have a structure in which aluminum oxide (Al$_2$O$_3$) is stacked over hafnium oxide (HfO$_2$). The HAH stack may have a structure in which hafnium oxide (HfO$_2$), aluminum oxide (Al$_2$O$_3$), and hafnium oxide (HfO$_2$) are sequentially stacked. The HA stack and the HAH stack may be referred to as a hafnium oxide (HfO$_2$)-base layer. In the ZA stack, ZAZ stack, HA stack, and HAH stack, aluminum oxide (Al$_2$O$_3$) may have a larger band gap than zirconium oxide (ZrO$_2$) and hafnium oxide (HfO$_2$). Aluminum oxide (Al$_2$O$_3$) may have a lower dielectric constant than zirconium oxide (ZrO$_2$) and hafnium oxide (HfO$_2$). Accordingly, the dielectric layer DE may include a stack of a high-k material and a high band gap material with a larger band gap than the high-k material. The dielectric layer DE may include silicon oxide (SiO$_2$) as a high band gap material other than aluminum oxide (Al$_2$O$_3$). The dielectric layer DE may include a high band gap material, thereby suppressing current leakage. The high band gap material may be extremely thin. The high band gap material may be thinner than the high-k material. According to another embodiment of the present invention, the dielectric layer DE may include a laminated structure in which a high-k material and a high band gap material are alternately stacked. For example, ZAZA (ZrO$_2$/Al$_2$O$_3$/ZrO$_2$/Al$_2$O$_3$), ZAZAZ (ZrO$_2$/Al$_2$O$_3$/ZrO$_2$/Al$_2$O$_3$/ZrO$_2$), HAHA (HfO$_2$/Al$_2$O$_3$/HfO$_2$/Al$_2$O$_3$) or HAHAH (HfO$_2$/Al$_2$O$_3$/HfO$_2$/Al$_2$O$_3$/HfO$_2$). In the laminated structure described above, aluminum oxide (Al$_2$O$_3$) may be extremely thin.

According to another embodiment of the present invention, the dielectric layer DE may include a stack structure, a laminated structure, or a mixed structure with zirconium oxide, hafnium oxide, and aluminum oxide.

According to another embodiment of the present invention, an interface control layer for improving current leakage may be further formed between the storage node SN and the dielectric layer DE. The interface control layer may include titanium oxide (TiO$_2$). The interface control layer may also be formed between the plate node PN and the dielectric layer DE.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide (RuO$_2$), iridium (IrO$_2$), platinum (Pt), molybdenum (Mo), molybdenum oxide (MoO), titanium nitride/tungsten (TiN/W) stack, tungsten nitride/tungsten (WN/W) stack. The plate node PN may include a combination of a metal-base material and a silicon-base material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN, and titanium nitride (TIN) may substantially serve as a plate node of a capacitor CAP, and tungsten nitride may be a low-resistance material.

The bit line BL may include a silicon-base material, a metal-base material, or a combination thereof. The bit line BL may include polysilicon, titanium nitride, tungsten, or a combination thereof. For example, the bit line BL may include polysilicon doped with an N-type impurity or titanium nitride (TIN). The bit line BL may include a stack of titanium nitride and tungsten (TiN/W). A barrier layer BR, such as titanium nitride, may be further included between the bit line BL and the first source/drain region SD1. The bit line BL may further include an Ohmic contact layer such as a metal silicide.

Figure 13A:
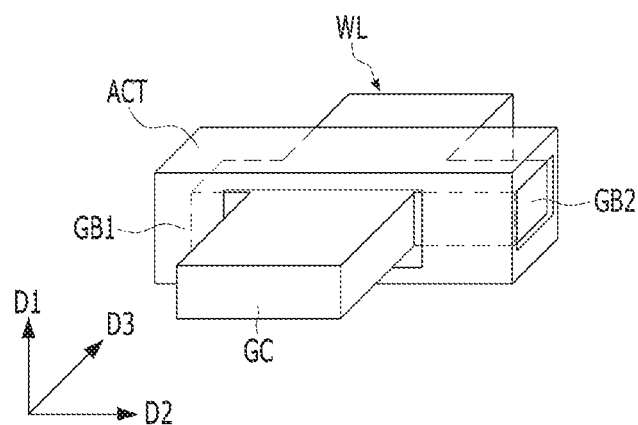
FIG. 13A is a perspective view, illustrating a portion of an individual memory cell, shown in FIG. 12.
Figure 13B:
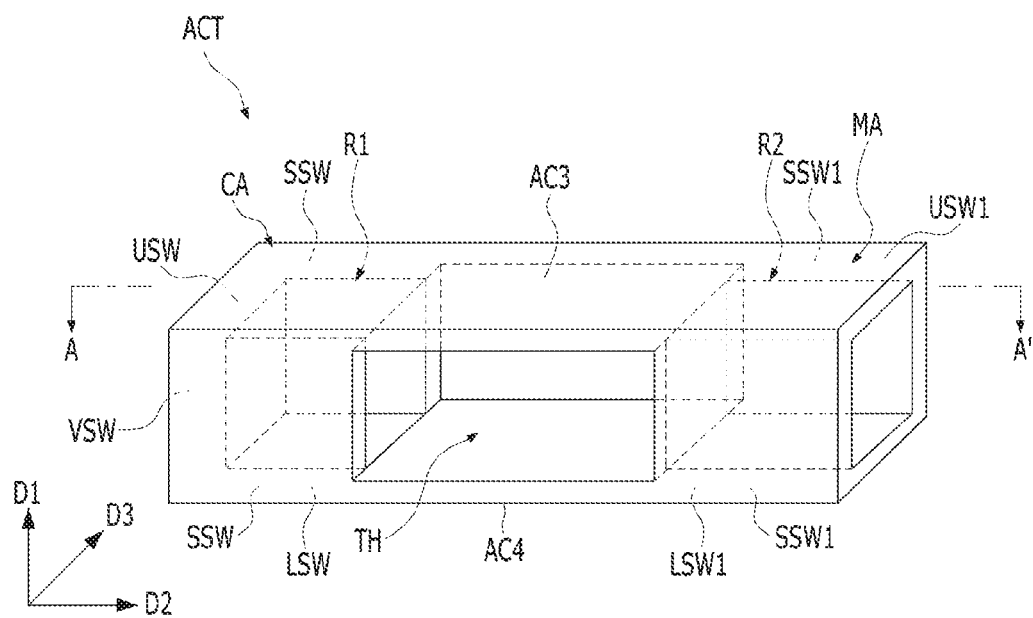
FIG. 13B is a perspective view, illustrating an active layer, shown in FIG. 13A.
Figure 13C:
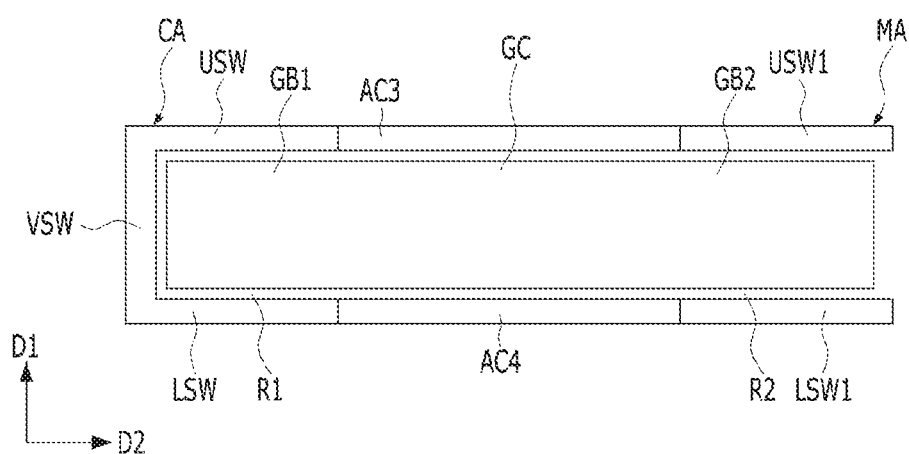
FIG. 13C is a cross-sectional view, taken along a line A-A', shown in FIG. 13B.
Figure 13D:
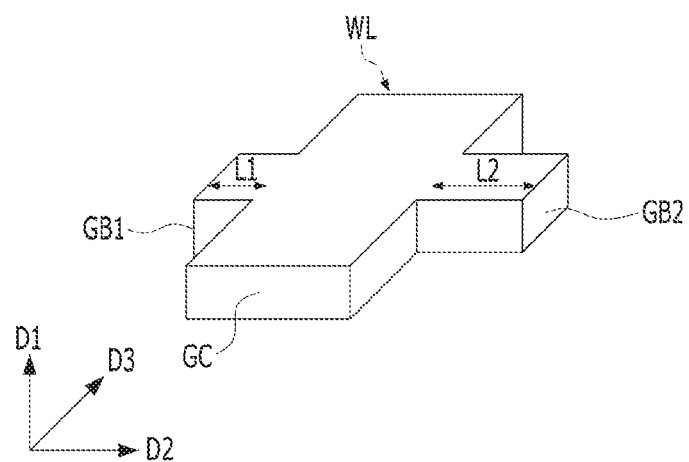
FIG. 13D is a perspective view illustrating a word line in detail.

FIG. 13A is a perspective view, illustrating a portion of an individual memory cell, shown in FIG. 12. FIG. 13A illustrates the active layer and the word line in detail. FIG. 13B is a detailed view of the active layer shown in FIG. 13A, and FIG. 13C is a cross-sectional view taken along a line A-A' as shown in FIG. 13B. FIG. 13D is a detailed view of a word line.

Referring to FIGS. 13A to 13D, the active layer ACT may extend in the second direction D2. The second direction D2 may be perpendicular to the first direction D1. The active layer ACT may be referred to as a lateral active layer. The active layer ACT may include a cylinder portion CA, a macaroni portion MA, and a pair of plate portions AC3 and AC4 that are laterally oriented between the cylinder portion CA and the macaroni portion MA. The pair of plate portions AC3 and AC4 may be positioned in parallel between the cylinder portion CA and the macaroni portion MA.

The word line WL may include a buried body portion GC that is disposed between the pair of the plate portions AC3 and AC4 to extend in the third direction D3, and the word line WL may include a first buried portion GB1 and a second buried portion GB2 that extend from the buried body portion GC. The first buried portion GB1 and the second buried portion GB2 may extend in the second direction D2. The first buried portion GB1 and the second buried portion GB2 may be referred to as a first buried gate electrode and a second buried gate electrode, respectively.

The cylinder portion CA and the macaroni portion MA of the active layer ACT may be spaced apart from each other in the second direction D2. The pair of the plate portions AC3 and AC4 may be formed laterally, extending in the second direction D2, between the cylinder portion CA and the macaroni portion MA. The pair of the plate portions AC3 and AC4 may be spaced apart from each other in parallel to the third direction D3.

The active layer ACT may further include a first recessed portion R1 and a second recessed portion R2. The first recessed portion R1 may be formed in the cylinder portion CA, and the second recessed portion R2 may be formed in the macaroni portion MA. The first recessed portion R1 and the second recessed portion R2 may be laterally oriented recesses and may have a shape recessed in the second direction D2. The first recessed portion R1 might not penetrate the cylinder portion CA, and the second recessed portion R2 may penetrate the macaroni portion MA. The cylinder portion CA may be referred to as one side closed cylinder one side of which is closed, and the macaroni portion MA may be referred to as an open type cylinder both sides of which are open.

The first recessed portion R1 may be defined by the interior of the cylinder portion CA, and the first recessed portion R1 may extend in the second direction D2. The first recessed portion R1 might not penetrate the cylinder portion CA. The cylinder portion CA may include an upper side wall USW, a lower side wall LSW, and a vertical edge side wall VSW. The cylinder portion CA may further include vertical side walls SSW between the upper side wall USW and the lower side wall LSW. The vertical etch side wall VSW of the cylinder portion CA may be coupled to the second source/drain region (see 'SD2' in FIG. 12). One plate portion AC3 may be coupled to the upper side wall USW of the cylinder portion CA, and the other plate portion AC4 may be coupled to the lower side wall LSW of the cylinder portion CA.

The second recessed portion R2 may be defined by the interior of the macaroni portion MA, and the second recessed portion R2 may extend in the second direction D2. The second recessed portion R2 may penetrate the macaroni portion MA in the second direction D2. The macaroni portion MA may further include an upper side wall USW1, a lower side wall LSW1, and vertical side walls SSW1 between the upper side wall USW1 and the lower side wall LSW1. A portion of the first source/drain region (SD1 of FIG. 12) may fill one end of the second recessed portion R2. One plate portion AC3 may be coupled to the upper side wall USW1 of the macaroni portion MA, and the other plate portion AC4 may be coupled to the lower side wall LSW1 of the macaroni portion MA.

The buried body portion GC of the word line WL may extend in the third direction D3. The first buried portion GB1 and the second buried portion GB2 may extend in the second direction D2. The first buried portion GB1 and the second buried portion GB2 may be coupled to both sides of the buried body portion GC. The first buried portion GB1 may laterally extend in the second direction D2 from the buried body portion GC. The second buried portion GB2 may laterally extend in the second direction D2 from the buried body portion GC. A lateral length L2 of the second buried portion GB2 in the second direction D2 may be longer than a lateral length L1 of the first buried portion GB1 in the second direction D2.

The buried body portion GC of the word line WL may have a shape buried between a pair of plate portions AC3 and AC4. The first buried portion GB1 may extend to be positioned in the inside of the first recessed portion R1 of the cylinder portion CA. The first buried portion GB1 may fill the first recessed position R1 of the cylinder portion CA. The second buried portion GB2 may extend to be positioned in the inside of the second recessed portion R2 of the macaroni portion MA. The second buried portion GB2 may fill the second recessed portion R2 of the macaroni portion MA. One end of the second buried portion GB2 might not be covered by the macaroni portion MC, and may be close to the first source/drain region (SD1 of FIG. 12). The macaroni portion MA may have a shape that surrounds the second buried portion GB2. For example, the remaining surfaces, except the sides confronting in the second direction D2 of the second buried portion GB2, may be covered by the macaroni portion MA.

Buried channels may be defined by the interior of the active layer ACT by the first buried portion GB1 and the second buried position GB2 of the word line WL.

Although not illustrated, a gate dielectric layer may be formed between the word line WL and the active layer ACT. The gate dielectric layer may be formed between the first buried portion GB1 of the word line WL and the cylinder portion CA. The gate dielectric layer may be formed between the second buried portion GB2 of the word line WL and the macaroni portion MA. The gate dielectric layer may be formed between the buried body portion GC of the word line WL and the plate portions AC3 and AC4. The gate dielectric layer may include silicon oxide, silicon nitride, silicon oxynitride, a high-k material, or a combination thereof.

The active layer ACT may include a semiconductor material, such as polysilicon. The active layer ACT may include doped polysilicon, undoped polysilicon, or amorphous silicon. The first active cylinder AC1, the second active cylinder AC2, and the plate portions AC3 and AC4 may be doped with an N-type impurity or a P-type impurity.

The word line WL may include a metal, a metal mixture, a metal alloy, a semiconductor material, a work function material, a barrier material, or a combination thereof.

Figure 14:
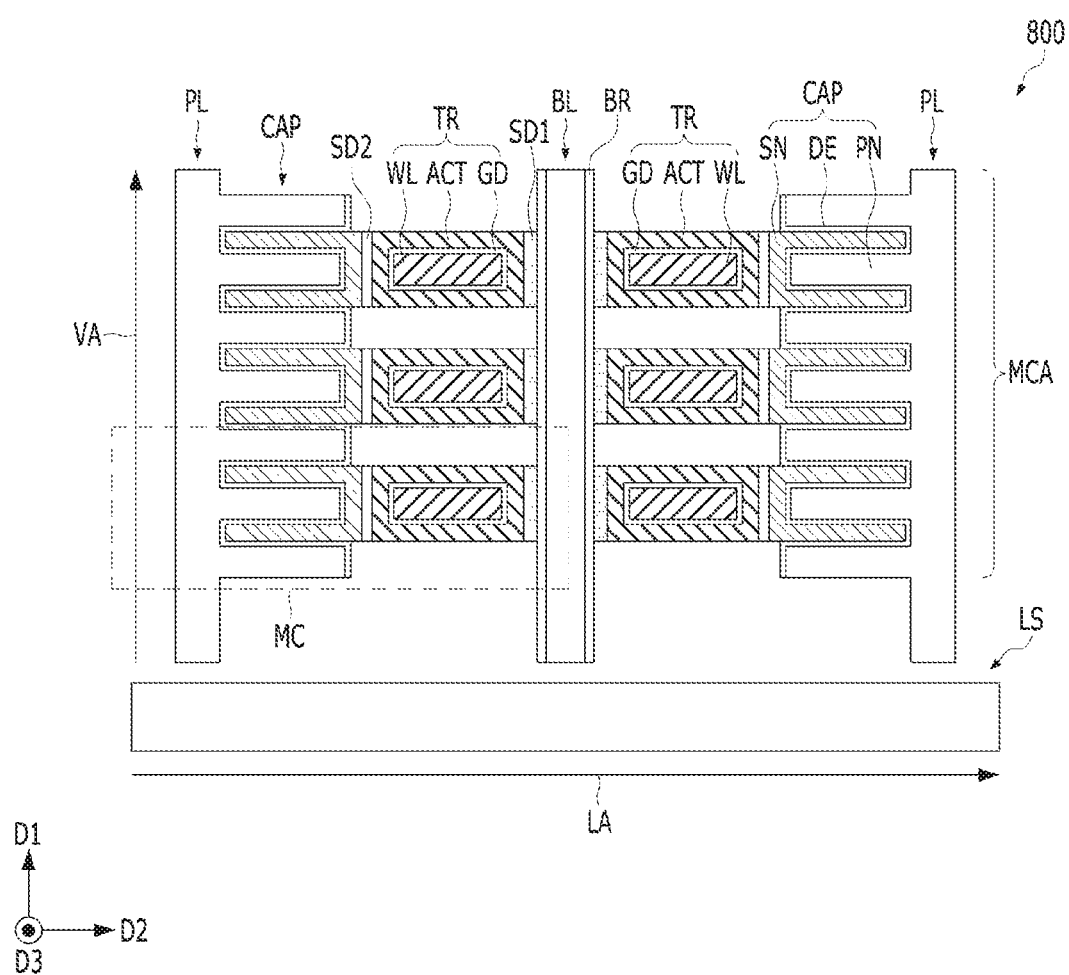
FIG. 14 is a cross-sectional view, schematically illustrating a structure of a memory device, in accordance with another embodiment of the present invention.

FIG. 14 is a cross-sectional view, schematically illustrating a structure of a memory device, in accordance with another embodiment of the present invention. The constituent elements of the memory device 800, except the active layer, may be similar to those of the memory device 700, shown in FIG. 12.

Referring to FIG. 14, the memory device 800 may include a base substrate LS, and a memory cell array MCA may be formed over the base substrate LS. The memory cell array MCA may be vertically arranged VA in the first direction D1 with respect to the base substrate LS. The memory cell array MCA may include a plurality of memory cells MC, and each of the memory cells MC may include a bit line BL, a transistor TR, a capacitor CAP, and a plate line PL. In the memory cell MC, the bit line BL, the transistor TR, the capacitor CAP, and the plate line PL may be positioned in a lateral arrangement LA in the second direction D2. Each memory cell MC may further include a word line WL, and the word line WL may extend in the third direction D3. The memory device 800 is illustrated to have a mirror-type structure that shares a bit line BL. According to another embodiment of the present invention, the memory device 800 may include a mirror-type structure sharing a plate line PL.

Each of the memory cells MC may include a bit line BL, a transistor TR, a capacitor CAP, and a plate line PL. The transistor TR may include an active layer ACT and a word line WL. The transistor TR may be positioned between the bit line BL and the capacitor CAP. The transistor TR may be positioned in a lateral arrangement LA in a second direction D2, which is parallel to the surface of the base substrate LS. In short, the transistor TR may be positioned laterally between the bit line BL and the capacitor CAP.

The bit line BL may extend from the base substrate LS in the first direction D1. The plane of the base substrate LS may extend in the second direction D3, and the first direction D1 may be perpendicular to the second direction D2. The bit line BL may be vertically oriented with respect to the base substrate LS. The bit line BL may have a pillar shape. The bit line BL may be referred to as a vertically oriented bit line or a pillar-type bit line. The bit line BL may include a conductive material. The bit line BL may include polysilicon, a metal, a metal nitride, a metal silicide, or a combination thereof. The vertically stacked memory cells MC may share one bit line BL. The bit line BL and the plate line PL may be spaced apart from each other and may be vertically oriented in the first direction D1. According to another embodiment of the present invention, the base substrate LS may include a peripheral circuit unit PC. The peripheral circuit unit PC may include a plurality of control circuits to control the memory cell array MCA. The bit line BL may be coupled to a peripheral circuit unit PC.

The transistor TR may include an active layer ACT, a gate dielectric layer GD, and a word line WL. The word line WL may extend in the third direction D3, and the active layer ACT may extend in the second direction D2. The third direction D3 may be a direction that is perpendicular to the first direction D1. The active layer ACT may be laterally arranged from the bit line BL. The word line WL may have a shape penetrating the active layer ACT. The word line WL may be an embedded word line that is embedded in the active layer ACT. The active layer ACT may have a tubular structure that is penetrated by the word line WL. Herein, the active layer ACT may have a shape that surrounds a portion of the word line WL. The active layer ACT may be formed separately on the basis of each memory cell MC.

The transistor TR may further include a first source/drain region SD1 and a second source/drain region SD2. The first source/drain region SD1 may be positioned between one side of the active layer ACT and the bit line BL. The second source/drain region SD2 may be positioned between another side of the active layer ACT and the capacitor CAP. The first source/drain region SD1 may be coupled to the bit line BL, and the second source/drain region SD2 may be coupled to the capacitor CAP. The first source/drain region SD1 may include a material that is selectively grown on one side wall of the active layer ACT. The second source/drain region SD2 may include a material that is selectively grown on another side wall of the active layer ACT. The first and second source/drain regions SD1 and SD2 may be formed separately from each other in each memory cell MC. The first source/drain region SD1 and the second source/drain region SD2 may include polysilicon doped with an N-type impurity. The first and second source/drain regions SD1 and SD2 may be formed by epitaxial growth of the polysilicon layer and impurity doping.

The capacitor CAP may be laterally positioned with respect to the transistor TR. The capacitor CAP may laterally extend in the second direction D2. The capacitor CAP may include a storage node SN, a dielectric layer DE, and a plate node PN. The storage node SN, the dielectric layer DE, and the plate node PN may be laterally arranged in the second direction D2. The storage node SN may be of a laterally oriented cylinder shape, and the plate node PN may be of a shape that extends into the cylindrical inside of the storage node SN. The dielectric layer DE may be positioned inside the storage node SN while surrounding the plate node PN. The plate node PN may be coupled to the plate line PL. The plate node PN and the plate line PL may be integrated. The plate node PN may include an internal node and a plurality of external nodes as shown in FIG. 5.

The bit line BL may include a silicon-base material, a metal-base material, or a combination thereof. The bit line BL may include polysilicon, titanium nitride, tungsten, or a combination thereof. For example, the bit line BL may include polysilicon that is doped with an N-type impurity or titanium nitride (TiN). The bit line BL may include a stack of titanium nitride and tungsten (TiN/W). A barrier layer BR, such as titanium nitride, may be further included between the bit line BL and the first source/drain region SD1. The bit line BL may further include an Ohmic contact layer, such as a metal silicide.

Figure 15A:
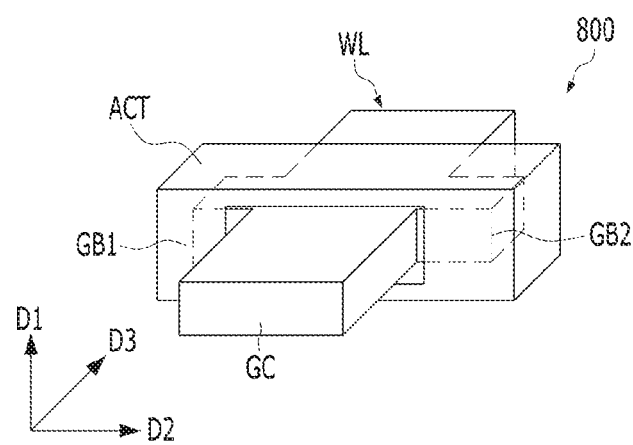
FIG. 15A is a perspective view, illustrating a portion of the individual memory cell, shown in FIG. 14.
Figure 15B:
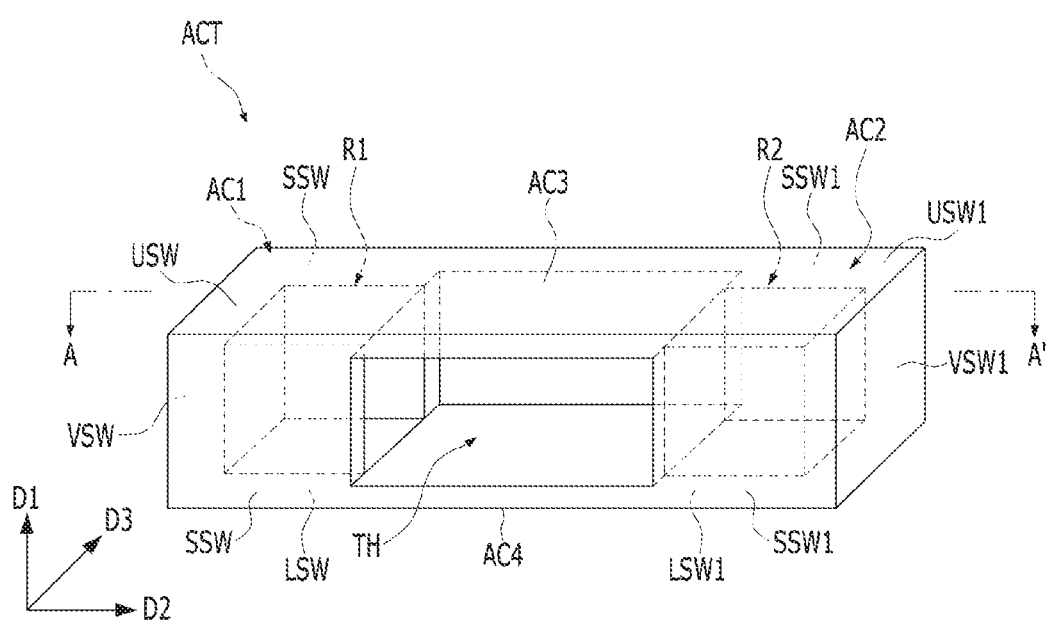
FIG. 15B is a perspective view, illustrating an active layer, shown in FIG. 15A.
Figure 15C:
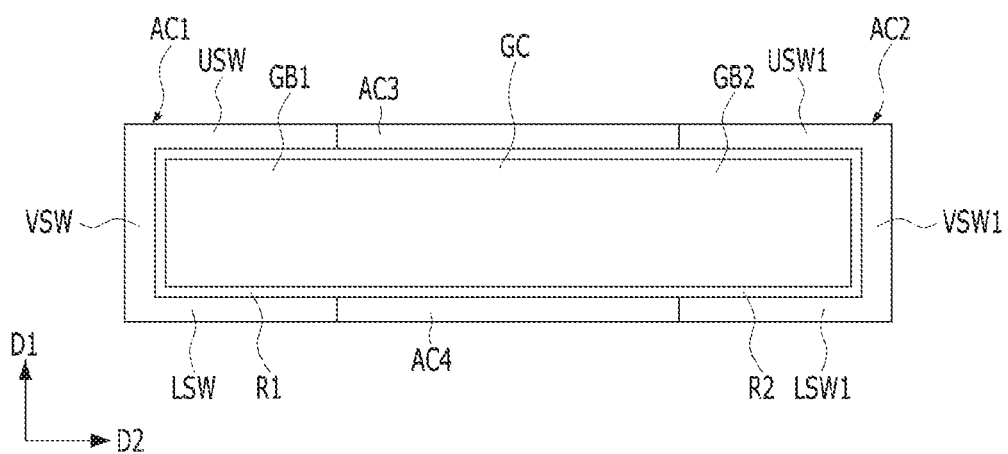
FIG. 15C is a cross-sectional view, taken along a line A-A', shown in FIG. 15B.
Figure 15D:
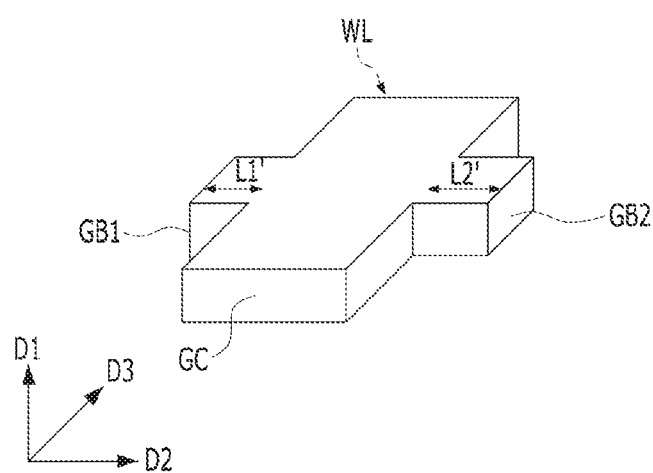
FIG. 15D is a perspective view illustrating a word line in detail.

FIG. 15A is a perspective view, illustrating a portion of the memory cell, shown in FIG. 14. FIG. 15A illustrates an active layer and a word line in detail. FIG. 15B is a perspective view, illustrating an active layer, shown in FIG. 15A. FIG. 15C is a cross-sectional view, taken along a line A-A', shown in FIG. 15B. FIG. 15D is a perspective view illustrating a word line in detail.

Referring to FIGS. 15A to 15D, the active layer ACT may extend in the second direction D2. The second direction D2 may be perpendicular to the first direction D1. The active layer ACT may be referred to as a lateral active layer. The active layer ACT may include a first active cylinder AC1, a second active cylinder AC2, and a pair of plate portions AC3 and AC4, the pair of plate portions AC3 and AC4 being laterally oriented between the first active cylinder AC1 and the second active cylinder AC2. The pair of the plate portions AC3 and AC4 may be positioned laterally between the first active cylinder AC1 and the second active cylinder AC2.

The word line WL may include a buried body portion GC that is positioned between the pair of the plate portions AC3 and AC4 to extend in the third direction D3, and the word line WL may include a first buried portion GB1 and a second buried portion GB2 that extend from the buried body portion GC. The first buried portion GB1 and the second buried portion GB2 may extend in the second direction D2. The first buried portion GB1 and the second buried portion GB2 may be referred to as a first buried gate electrode and a second buried gate electrode, respectively.

The first active cylinder AC1 and the second active cylinder AC2 may be spaced apart from each other in the second direction D2. The pair of the plate portions AC3 and AC4 may be formed laterally long in the second direction D2 between the first active cylinder AC1 and the second active cylinder AC2. The pair of the plate portions AC3 and AC4 may be spaced apart from each other in parallel to the third direction D3.

The active layer ACT may further include a first recessed portion R1 and a second recessed portion R2. The first recessed portion R1 may be formed in the inside of the first active cylinder AC1, and the second recessed portion R2 may be formed in the inside of the second active cylinder AC2. The first recessed portion R1 and the second recessed portion R2 may be laterally oriented recesses and may have a shape recessed in the second direction D2. The first recessed portion R1 might not penetrate the first active cylinder AC1, and the second recessed portion R2 might not penetrate the second active cylinder AC2.

The first recessed portion R1 may be defined by the interior of the first active cylinder AC1, and the first recessed portion R1 may extend in the second direction D2. The first recessed portion R1 might not penetrate the first active cylinder AC1. The first active cylinder AC1 may include an upper side wall USW, a lower side wall LSW, and a vertical edge side wall VSW. The first active cylinder AC1 may further include vertical side walls SSW between the upper side wall USW and the lower side wall LSW. The vertical edge side wall VSW of the first active cylinder AC1 may be coupled to the second source/drain region (see 'SD2' in FIG. 14). One plate portion AC3 may be coupled to the upper side wall USW of the first active cylinder AC1, and the other plate portion AC4 may be coupled to the lower side wall LSW of the first active cylinder AC1.

The second recessed portion R2 may be defined by the interior of the second active cylinder AC2, and the second recessed portion R2 may extend in the second direction D2. The second recessed portion R2 might not penetrate the second active cylinder AC2. The second active cylinder AC2 may include an upper side wall USW1, a lower side wall LSW1, and a vertical edge side wall VSW1. The second active cylinder AC2 may further include vertical side walls SSW1 between the upper side wall USW1 and the lower side wall LSW1. The vertical edge side wall VSW1 of the second active cylinder AC2 may be coupled to the first source/drain region (see 'SD1' in FIG. 14). One plate portion AC3 may be coupled to the upper side wall USW1 of the second active cylinder AC2, and the other plate portion AC4 may be coupled to the lower side wall LSW of the second active cylinder AC2.

As described above, the active layer ACT may include a first active cylinder AC1, a second active cylinder AC2, and a pair of plate portions AC3 and AC4. The first active cylinder AC1 may be coupled to one-side edges of the pair of the plate portions AC3 and AC4, and the second active cylinder AC2 may be coupled to the other-side edges of the pair of the plate portions AC3 and AC4. The first active cylinder AC1 and the second active cylinder AC2 may be parallel to each other in the second direction D2. The first active cylinder AC1 and the second active cylinder AC2 may be symmetrical to each other in the second direction D2. The first recessed portion R1 and the second recessed portion R2 may be symmetrical to each other. The shapes, sizes, depths, widths and heights of the first recessed portion R1 and the second recessed portion R2 may be the same. The first active cylinder AC1 and the second active cylinder AC2 may have a lateral cylinder shape. The first and second active cylinders AC1 and AC2 may be referred to as one side-closed cylinders one sides of which are closed by the vertical edge side walls VSW and VSW1, respectively.

The buried body portion GC of the word line WL may extend long in the third direction D3. The first buried portion GB1 and the second buried portion GB2 may extend in the second direction D2. The first buried portion GB1 and the second buried portion GB2 may be coupled to both sides of the buried body portion GC. The first buried portion GB1 may laterally extend in the second direction D2 from the buried body portion GC. The second buried portion GB2 may laterally extend in the second direction D2 from the buried body portion GC.

The buried body portion GC of the word line WL may have a shape that is embedded between the pair of the plate portions AC3 and AC4. The first buried portion GB1 may extend to be positioned in the inside of the first recessed portion R1 of the first active cylinder AC1. The first buried portion GB1 may fill the first recessed portion R1 of the first active cylinder AC1. The second buried portion GB2 may extend to be positioned in the second recessed portion R2 of the second active cylinder AC2. The second buried portion GB2 may fill the second recessed portion R2 of the second active cylinder AC2. The lateral length L1' of the first buried portion GB1 in the second direction D2 and the lateral length L2' of the second buried portion GB2 in the second direction D2 may be the same.

A buried channel may be defined by the interior of the first active cylinder AC1 and the second active cylinder AC2 by the first buried portion GB1 and the second buried portion GB2 of the word line WL.

Although not illustrated, a gate dielectric layer may be formed between the word line WL and the active layer ACT. The gate dielectric layer may be formed between the first buried portion GB1 of the word line WL and the first active cylinder AC1. The gate dielectric layer may be formed between the second buried portion GB2 of the word line WL and the second active cylinder AC2. The gate dielectric layer may conformally cover the surface of the first recessed portion R1 of the first active cylinder AC1 and the surface of the second recessed portion R2 of the second active cylinder AC2. The gate dielectric layer may be formed between the buried body portion GC of the word line WL and the plate portions AC3 and AC4. The gate dielectric layer may include silicon oxide, silicon nitride, silicon oxynitride, a high-k material, or a combination thereof.

The active layer ACT may include a semiconductor material, such as polysilicon. The active layer ACT may include doped polysilicon, undoped polysilicon, or amorphous silicon. The first active cylinder AC1, the second active cylinder AC2, and the plate portions AC3 and AC4 may be doped with an N-type impurity or a P-type impurity.

The word line WL may include a metal, a metal mixture, a metal alloy, a semiconductor material, a work function material, a barrier material, or a combination thereof.

According to another embodiment of the present invention, the first active cylinder AC1 and the second active cylinder AC2 may be asymmetric with each other. For example, the lateral length of the first active cylinder AC1 may be shorter than the lateral length of the second active cylinder AC2. Also, the lateral length of the first active cylinder AC1 may be longer than the lateral length of the second active cylinder AC2.

Figure 16A:
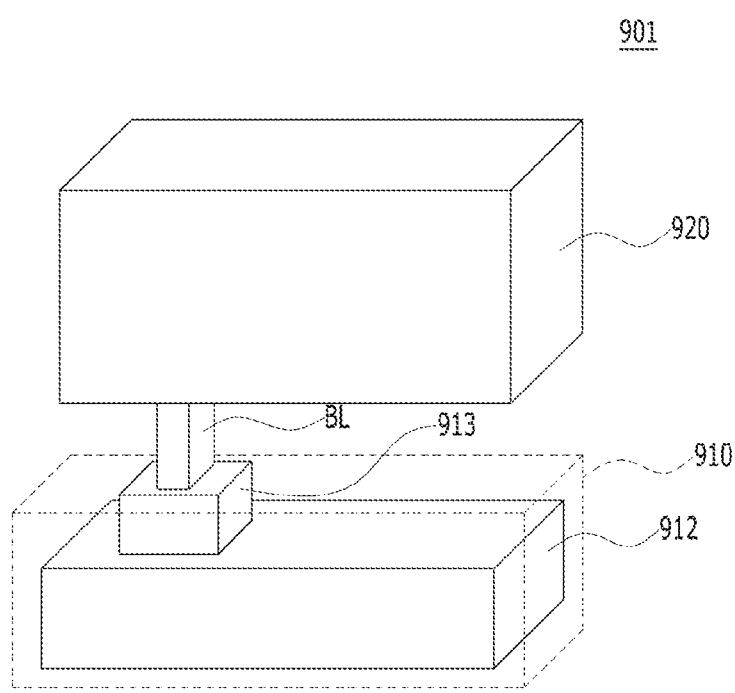
FIGS. 16A and 16B are perspective views, illustrating memory devices, in accordance with another embodiment of the present invention.
Figure 16B:
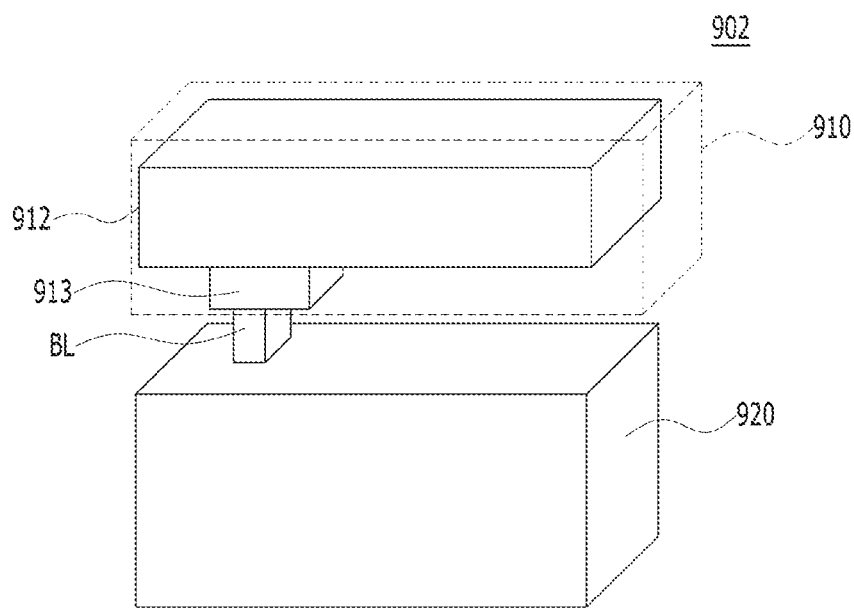

FIGS. 16A and 16B are perspective views, illustrating memory devices 901 and 902, in accordance with another embodiment of the present invention.

Referring to FIGS. 16A and 16B, each of the memory devices 901 and 902 may include a peripheral circuit unit 910 and a memory cell array 920. The memory cell array 920 may include at least one memory cell array MCA among the memory cell arrays MCA that are described in the above embodiments of the present invention. The memory cell array MCA may include a DRAM memory cell array.

Referring to FIG. 16A, the memory cell array 920 may be positioned over the peripheral circuit unit 910. Accordingly, the memory device 901 may have a PUC (Peripheral circuit unit-under-Cell) structure.

Referring to FIG. 16B, the memory cell array 920 may be positioned under the peripheral circuit unit 910. Accordingly, the memory device 902 may have a CUP (Cell-under-Peripheral circuit unit) structure.

The peripheral circuit unit 910 may refer to a circuit for driving the memory cell array 920 during a read/write operation. The peripheral circuit unit 910 may include an N-channel transistor, a P-channel transistor, a CMOS circuit, or a combination thereof. The peripheral circuit unit 910 may include an address decoder circuit, a read circuit, and a write circuit. The peripheral circuit unit 910 may have a structure with a semiconductor substrate 912 and a sense amplifier 913 which is arranged over the semiconductor substrate 912. The sense amplifier 913 may include transistors with the semiconductor substrate 912 as a channel, and the transistors may be planar channel transistors whose channels are parallel to the surface of the semiconductor substrate 912. In addition to the planar channel transistor, the transistor structure in the sense amplifier 913 may include a recess channel transistor, a buried gate transistor, and a fin channel transistor (FinFET).

The bit lines BL of the memory cell array 920 may be electrically connected to transistors of the sense amplifier 913. Although not illustrated, the bit lines BL and the transistors of the sense amplifier 913 may be coupled to each other through a multi-level metal wire MLM. The multi-layer level metal wire MLM may be formed by a damascene process.

Although not illustrated, according to another embodiment of the present invention, the memory devices 901 and 902 may include a first semiconductor substrate and a second semiconductor substrate bonded to the first semiconductor substrate. The memory cell array 920 may be formed over the first semiconductor substrate, and the peripheral circuit unit 910 may be formed over the second semiconductor substrate. Each of the first semiconductor substrate and the second semiconductor substrate may include conductive bonding pads, and the first semiconductor substrate and the second semiconductor substrate may be bonded to each other through the conductive bonding pads. As a result, the memory cell array 920 and the peripheral circuit unit 310 may be electrically connected.

Figure 17:
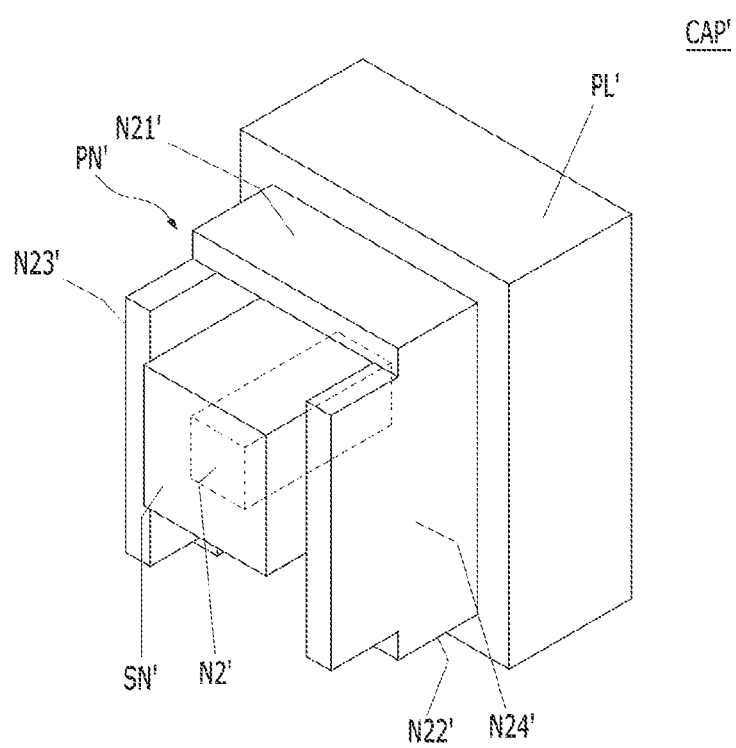
FIG. 17 is a perspective view, illustrating a capacitor, in accordance with another embodiment of the present invention.

FIG. 17 is a perspective view, illustrating a capacitor CAP', in accordance with another embodiment of the present invention.

Referring to FIG. 17, a plate node PN' of the capacitor CAP' may include an internal nodes N2' and external nodes N21', N22', N23', and N24'.

The external nodes N21', N22', N23', and N24' may include a first external node N21', a second external node N22', a third external node N23', and a fourth external node N24'. The first external node N21' and the second external node N22' may be positioned in the upper side and the lower side of a storage node SN', and the third external node N23' and the fourth external node N24' may be positioned on the sides of the storage node SN'.

The lateral lengths of the first external node N21' and the second external node N22' may be the same. The lateral lengths of the third external node N23' and the fourth external node N24' may be the same. The lateral lengths of the first external node N21' and the second external node N22' may be shorter than the lateral lengths of the third external node N23' and the fourth external node N24'.

Since the lateral lengths of the third external node N23' and the fourth external node N24' are long, they may be able to support the storage node SN more stably.

According to the embodiments of the present invention, the three-dimensional memory device includes transistors and capacitors that are stacked over a substrate in three dimensions. As a result, the degree of integration of the memory device may be improved.

While the present invention has been described with respect to the specific embodiments, it will be apparent to those skilled in the art that various changes and modifications may be made without departing from the spirit and scope of the invention as defined in the following claims.

What is claimed is:

1. A memory cell, comprising:
   a bit line and a plate line that are spaced apart from each other and vertically oriented in a first direction;
   a transistor including an active layer, the active layer being laterally oriented in a second direction, intersecting with the bit line;
   a capacitor laterally oriented in the second direction between the active layer and the plate line; and
   a word line laterally oriented in a third direction, intersecting with the bit line and the active layer, wherein the word line is embedded in the active layer.

2. The memory cell of claim 1, wherein the active layer includes a through portion extending in the third direction, and the word line is positioned in the through portion.

3. The memory cell of claim 1, wherein the active layer includes:
   a first active cylinder coupled to the bit line;
   a second active cylinder coupled to the capacitor; and
   a pair of plate portions laterally oriented between the first active cylinder and the second active cylinder.

4. The memory cell of claim 3, wherein the first active cylinder, the second active cylinder, and the pair of the plate portions are positioned in a lateral arrangement in the second direction.

5. The memory cell of claim 3, wherein the word line includes:
   a buried body portion positioned between the pair of the plate portions and extending in the third direction;
   a first buried portion extending from one side of the buried body portion and buried in a cylinder-shaped interior of the first active cylinder; and
   a second buried portion extending from another side of the buried body portion and buried in a cylinder-shaped interior of the second active cylinder.

6. The memory cell of claim 3, wherein the first active cylinder and the second active cylinder are positioned at the same level and have laterally oriented cylinder shapes that are laterally spaced apart in the second direction.

7. The memory cell of claim 3, wherein a lateral length of the first active cylinder in the second direction and a lateral length of the second active cylinder in the second direction are different.

8. The memory cell of claim 3, wherein the first active cylinder includes a laterally oriented first recess, and
   the second active cylinder includes a laterally oriented second recess, and
   the laterally oriented first recess and laterally oriented second recess face each other in the second direction.

9. The memory cell of claim 1, further comprising:
   a gate dielectric layer formed between the word line and the active layer.

10. The memory cell of claim 1, wherein the capacitor includes:
    a storage node coupled to the transistor;
    a plate node coupled to the plate line; and
    a dielectric material between the storage node and the plate node, and
    the storage node, the dielectric material, and the plate node are positioned in a lateral arrangement in the second direction.

11. The memory cell of claim 10, wherein the plate node includes:
    an internal node laterally oriented from the plate line and extending into a cylinder-shaped interior of the storage node; and
    a plurality of external nodes that are laterally oriented from the plate line and surrounding a cylinder-shaped exterior of the storage node.

12. The memory cell of claim 11, wherein the external nodes include:
    first and second external nodes positioned on the cylinder-shaped exterior of the storage node in the first direction; and
    third and fourth external nodes positioned on the cylinder-shaped exterior of the storage node in the third direction, and
    lateral lengths of the first external node and the second external node are shorter than lateral lengths of the third external node and the fourth external node.

13. The memory cell of claim 12, wherein a lateral length of the first external node and a lateral length of the second external node are the same, and
    a lateral length of the third external node and a lateral length of the fourth external node are the same.

14. The memory cell of claim 1, further comprising:
    a first source/drain region formed between the active layer and the bit line; and
    a second source/drain region formed between another side of the active layer and the capacitor.

15. The memory cell of claim 1, wherein the active layer includes:
    a vertical edge side wall between the capacitor and the word line;
    a pair of plate portions extending from upper and lower portions of the vertical edge side wall; and
    an open side wall between the word line and bit line.

16. The memory cell of claim 15, further comprising:
a first source/drain region coupled to the bit line while filling the open side wall of the active layer;
a second source/drain region selectively grown from the vertical edge side wall of the active layer and coupled to the capacitor; and
an Ohmic contact layer between the first source/drain region and the bit line.

17. A memory device, comprising:
a memory cell array including a plurality of memory cells that are vertically arrayed in a first direction,
wherein each of the memory cells includes:
- a bit line and a plate line that are spaced apart from each other and vertically oriented in the first direction;
- a transistor including an active layer, the active layer being laterally oriented in a second direction, intersecting with the bit line, wherein the transistor includes a first active cylinder, a second active cylinder, and a pair of plate portions that are laterally oriented between the first active cylinder and the second active cylinder;
- a word line laterally oriented in a third direction, while penetrating between the pair of the plate portions of the active layer; and
- a capacitor laterally oriented in the second direction between the active layer and the plate line.

18. The memory device of claim 17, wherein the word line includes:
- a buried body portion extending in the third direction while penetrating between the pair of the plate portions;
- a first buried portion laterally extending in the second direction from one side of the buried body portion and buried in the first active cylinder; and
- a second buried portion laterally extending in the second direction from another side of the buried body portion and buried in the second active cylinder.

19. The memory device of claim 17, further comprising:
a peripheral circuit unit positioned below the memory cell array and including at least one control circuit for controlling the memory cells.

20. The memory device of claim 17, further comprising:
a peripheral circuit unit positioned over the memory cell array and including at least one control circuit for controlling the memory cells.

\* \* \* \* \*